United States Patent
Kobayashi

(10) Patent No.: US 7,564,736 B2
(45) Date of Patent: Jul. 21, 2009

(54) SEMICONDUCTOR MEMORY AND SYSTEM

(75) Inventor: Hiroyuki Kobayashi, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 139 days.

(21) Appl. No.: 11/892,975

(22) Filed: Aug. 29, 2007

(65) Prior Publication Data
US 2008/0074942 A1 Mar. 27, 2008

(30) Foreign Application Priority Data
Sep. 27, 2006 (JP) .............................. 2006-262757

(51) Int. Cl.
*G11C 8/00* (2006.01)
(52) U.S. Cl. ............................ 365/230.06; 365/189.09
(58) Field of Classification Search ............ 365/230.06, 365/189.09, 222
See application file for complete search history.

(56) References Cited

U.S. PATENT DOCUMENTS

| | | | | |
|---|---|---|---|---|
| 5,467,032 A | * | 11/1995 | Lee ............................. | 326/88 |
| 5,602,796 A | * | 2/1997 | Sugio ..................... | 365/230.06 |
| 5,602,797 A | * | 2/1997 | Kang ..................... | 365/230.06 |
| 5,617,369 A | | 4/1997 | Tomishima et al. | |
| 5,701,143 A | | 12/1997 | Rao | |

FOREIGN PATENT DOCUMENTS

JP 2005-158223 A 6/2005

* cited by examiner

*Primary Examiner*—Anh Phung
(74) *Attorney, Agent, or Firm*—Arent Fox LLP

(57) ABSTRACT

A word decoder, word driver, and voltage control circuit are formed corresponding to a memory block, respectively. The word decoder generates word control signals supplied to the gate of the word driver's transistor. The voltage control circuit sets word control signal high level voltage supplied to the word decoder to a first high voltage during an access period of corresponding memory block and to a second high voltage lower than the first one during non-access period of corresponding memory block. The high level voltage is switched to the first or second high voltage only in the word control circuit corresponding to the memory block whose access state changes. Consequently, wasteful charge/discharge current occurrence can be prevented in high level voltage lines corresponding to the memory block whose access state does not change and charge/discharge currents due to circuit operations to reduce GIDL currents, and current consumption can be reduced.

15 Claims, 28 Drawing Sheets

SEMICONDUCTOR MEMORY AND SYSTEM

CROSS REFERENCE TO RELATED APPLICATION

This application is based upon and claims the benefit of priority from Japanese Patent Application No. 2006-262757, filed on Sep. 27, 2006, the entire contents of which are incorporated herein by reference.

BACKGROUND

1. Field

The present invention relates to a semiconductor memory having a memory cell and a word line connected to the memory cell.

2. Description of the Related Art

Recently, a semiconductor memory such as a DRAM, a pseudo SRAM, etc., is employed as a work memory to be mounted on portable equipment such as a mobile phone etc. Since a memory cell (dynamic memory cell) of the DRAM is small compared to a memory cell of the SRAM, the employment of the DRAM will reduce the manufacturing cost. On the other hand, the semiconductor memory having the dynamic memory cell sets a selection voltage of a word line to a voltage higher than a power supply voltage in order to increase the amount of charges of data to be held in the memory cell and to improve the read margin.

In a transistor the gate of which is provided with a high voltage, a gated induced drain leakage (GIDL) current tends to occur. Since the GIDL current flows between the drain and the substrate of the transistor depending on the gate voltage, the larger the gate voltage, the larger the GIDL current becomes. Because of this, in the semiconductor memory of this kind, the increase in the standby current due to the GIDL of the transistor that receives a high voltage at the gate is a serious problem in the word driver. In particular, in a pMOS transistor that receives a high voltage at the gate, the high voltage is supplied to the substrate (well) and therefore the voltage difference between the drain and the substrate becomes large and the GIDL current tends to become large. A technique has been proposed (for example, Japanese Unexamined Patent Application Publication No. 2005-158223), which lowers the level of the high voltage to be supplied to the gate of the transistor of the word driver during the standby period during which the memory cell is not accessed in order to reduce the GIDL current and the standby current.

In the above-described technique, the voltage line that supplies a high voltage is connected to all of the word decoders. Because of this, there used to be a problem in that charges of the voltage line are charged/discharged each time the levels of the high voltage are switched and the current consumption increases. In particular, in the self-refresh mode (standby mode) in which the refresh operation is repeated automatically inside the semiconductor memory, due to the charge/discharge current caused by the switching of the high voltage level, the standby current increases. In other words, there is a possibility that the amount of the charge/discharge current due to the circuit operation to reduce the GIDL current becomes larger than the amount of reduction in the GIDL current.

SUMMARY

An object of the present invention is to control the switching of the high voltage level in an optimum manner corresponding to the access situation, to reduce the charge/discharge current due to the circuit operation to reduce the GIDL current, and to reduce the current consumption.

In an embodiment of a semiconductor memory of the present invention, word control circuits are formed respectively corresponding to memory blocks in order to activate/inactivate the level of a word line of the memory block. Each memory block has a memory cell and a word line connected to the memory cell. Each word control circuit has a word decoder, a word driver, and a voltage control circuit. The word decoder activates a word control signal to a low level voltage during an access period of a corresponding memory block and inactivates the word control signal to a high level voltage during a non-access period of the corresponding memory block. The word driver has a transistor that receives the word control signal at the gate and the output of which is connected to the word line, respectively. The word driver activates the word line selected by an address during the access period and inactivates the word line during the non-access period by using the transistor.

The voltage control circuit connects a high level voltage line for supplying a high level voltage for the word control signal to the word decoder to a first high voltage line to which a first high voltage is supplied during the access period of the corresponding memory block.

The voltage control circuit performs a first operation for connecting the high level voltage line to a second high voltage line to which a second high voltage lower than the first high voltage is supplied during the non-access period of the corresponding memory block. The voltage to be applied to the gate of the transistor of the word driver is set for each memory block corresponding to the access state of the memory block. In other words, the voltage of the high level voltage line is switched to the first or second high voltage only in the word control circuit corresponding to the memory block the access state of which changes. Consequently, it is possible to prevent a wasteful charge/discharge current from occurring in a high level voltage line corresponding to the memory block the access state of which does not change, and the charge/discharge current due to the circuit operation in order to reduce a GIDL current can be reduced and the current consumption of the semiconductor memory can be reduced.

DETAILED DESCRIPTION OF THE EMBODIMENTS

Figure 1:
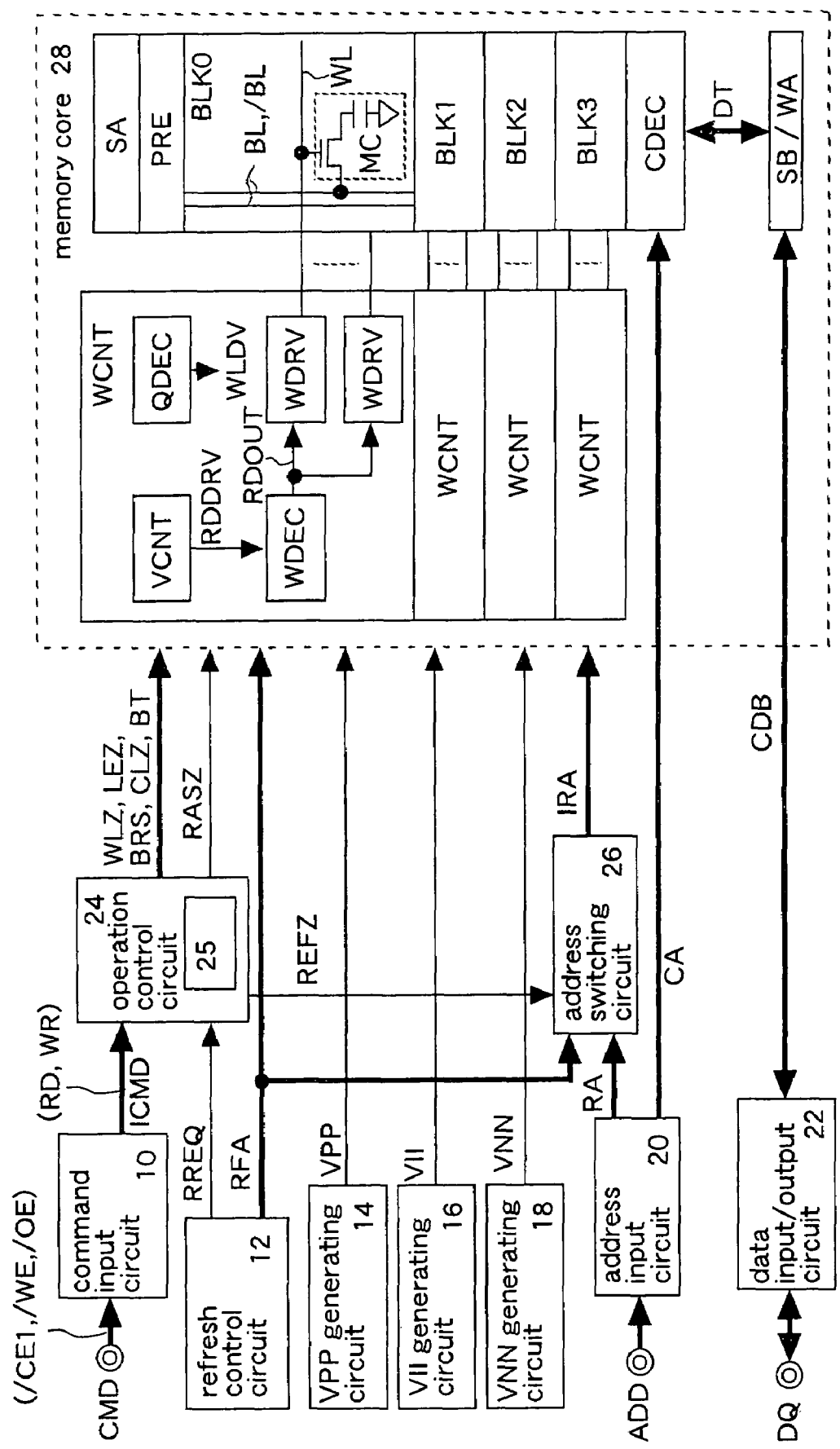
FIG. 1 is a block diagram showing a first embodiment of the present invention.

Hereinafter, embodiments of the present invention will be described, using the drawings. Each double circle in the drawings represents an external terminal. In the drawings, each signal line shown by the heavy line is constituted of a plurality of lines. Some of blocks to which the heavy lines are connected is constituted of a plurality of circuits. Each signal supplied via the external terminal is denoted by the same reference symbol as the terminal name. Each signal line through which the signal is transmitted is denoted by the same reference symbol as the signal name. Each signal ending with "Z" represents positive logic. Each signal ending with "X" or each signal starting with "/" represents negative logic.

FIG. 1 shows a first embodiment of the present invention. The semiconductor memory is formed as a pseudo SRAM using a CMOS process on a silicon substrate. The pseudo SRAM has a memory core of DRAM and an interface of SRAM. The pseudo SRAM performs a refresh operation periodically inside a chip without receiving a refresh command from the outside and holds data written to the memory cell. The pseudo SRAM is used, for example, as a work memory mounted in a mobile phone. Read operation and write operation are performed in accordance with command signals CMD (read command RD and write command WR) supplied via an external terminal.

The pseudo SRAM has a command input circuit 10, a refresh control circuit 12, a VPP generating circuit 14, a VII generating circuit 16, a VNN generating circuit 18, an address input circuit 20, a data input/output circuit 22, an operation control circuit 24, an address switching circuit 26, and a memory core 28. By the way, in FIG. 1, only main signals necessary for the description of the present invention are shown.

The command input circuit 10 (command decoder) receives a command signal CMD (for example, chip enable signal /CE, write enable signal /WE, output enable signal /OE, etc.) via a command terminal. The command input circuit 10 decodes the received command signal CMD (access request) and outputs internal command signals ICMD (read command RD and write command WR) to cause the memory core 28 to operate.

The refresh control circuit 12 has a refresh timer and a refresh address counter, not shown. The refresh timer generates an internal refresh request signal RREQ (refresh command) at a predetermined period. The refresh address counter operates to count in accordance with the refresh request signal RREQ and generates a refresh address signal RFA composed of a plurality of bits sequentially. The refresh address signal RFA is a row address signal for selecting a word line WL, to be described later. In greater detail, the refresh address signal RFA shows a memory cell MC that refreshes and a refresh block REFBLK (FIG. 10), which is a memory block BLK (any one of BLK0-3) to which the memory cell MC that refreshes belongs.

The VPP generating circuit 14 generates a fixed boost voltage VPP higher than a power supply voltage from the power supply voltage (external power supply voltage) supplied via the external terminal. The boost voltage VPP is used as a high level voltage of the word line WL etc. The VII generating circuit 16 (internal power supply voltage generating circuit) generates a fixed internal power supply voltage VII by stepping down the power supply voltage. The internal power supply voltage VII is supplied to almost all the circuits except the memory blocks BLK0-3, the input circuits 10 and 20 and the data input/output circuit 22 connected to the external terminal, and the voltage generating circuits 14, 16, and 18.

The VNN generating circuit 18 (negative voltage generating circuit) generates a fixed negative voltage VNN using the power supply voltage and the ground voltage. The negative voltage VNN is used as a low level voltage of the word line WL etc. The VPP generating circuit 14, the VII generating circuit 16, and the VNN generating circuit 18 generate the fixed voltages VPP, VII, and VNN irrespective of the change in the power supply voltage.

The address input circuit 20 receives an address signal ADD supplied from an address terminal and outputs the received signal as a row address signal RA and a column address signal CA. The row address signal RA is used to select the word line WL. The column address signal CA is used to select a bit line BL (or /BL).

The data input/output circuit 22 outputs read data to be transferred from the memory core 28 via a common data bus CDB to a data terminal DQ at the time of read operation. The data input/output circuit 18 receives write data to be supplied via the data terminal DQ at the time of write operation and transfers the received data to the memory core 28 via the common data bus CDB.

The operation control circuit 24 has an arbiter 25 that determines which is given priority when the internal command signal ICMD and the refresh request signal RREQ input asynchronously conflict with each other. The operation control circuit 24 outputs a refresh signal REFZ when performing the refresh operation in response to the refresh command.

The refresh operation is performed by the arbiter 25 between an interval of the read operations in response to the read command supplied from the outside of the pseudo SRAM or the write operations in response to the write command. In other words, the refresh operation is performed automatically inside the pseudo SRAM.

The operation control circuit 24 outputs timing signals, such as a word control signal WLZ, a latch enable signal LEZ, a bit line reset signal BRS, a column control signal CLZ, a switch control signal BT, etc., for operating the memory core 28 in response to the internal command signal ICMD (read command RD and write command WR) or the refresh request signal RREQ (refresh command) that has been determined to have priority by the arbiter 25. In addition, the operation control circuit 24 outputs a basic timing signal RASZ for causing the memory core 28 to perform the access operation (read operation, write operation, and refresh operation) in response to the internal command signal ICMD or the refresh request signal RREQ.

The word control signal WLZ is a timing signal to select the word line WL. The latch enable signal LEZ is a timing signal to operate a sense amplifier SA inside the memory core 28. The bit line reset signal BRS is a timing signal to operate a precharge circuit PRE inside the memory core 28. The column control signal CLZ is a timing signal to select a column switch inside the memory core 28 and is output in response only to the internal command signal ICMD.

The address switching circuit 26 outputs the row address signal RA as an internal row address signal IRA while receiving the low level refresh signal REFZ (during the read operation or write operation, or during the period of standby). The address switching circuit 26 outputs the refresh address signal RFA as the internal row address signal IRA while receiving the high level refresh signal REFZ (during the refresh operation). In other words, during the read operation and write operation, and during the period of standby, the row address signal RA supplied from the outside is selected and during the refresh operation, the refresh address signal RFA generated internally is selected.

The memory core 28 has the plurality of the memory blocks BLK (BLK0-3), word control circuits WCNT corresponding to the memory blocks BLK0-3, respectively, the sense amplifier SA, the precharge circuit PRE, the column decoder CDEC, a sense buffer SB, a write amplifier WA, etc.

Figure 4:
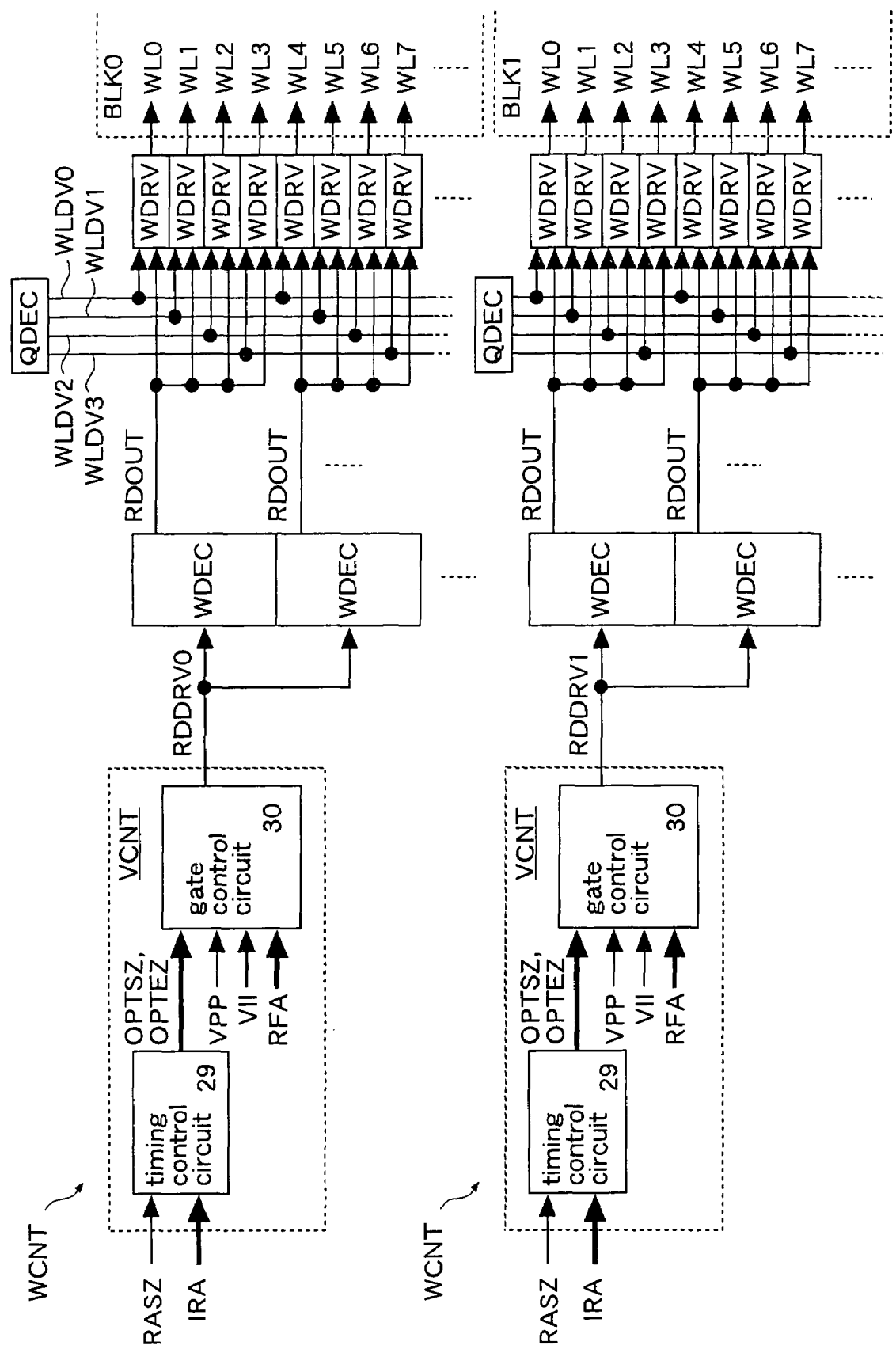
FIG. 4 is a block diagram showing the outline of a word control circuit WCNT shown in FIG. 1.
Figure 5:
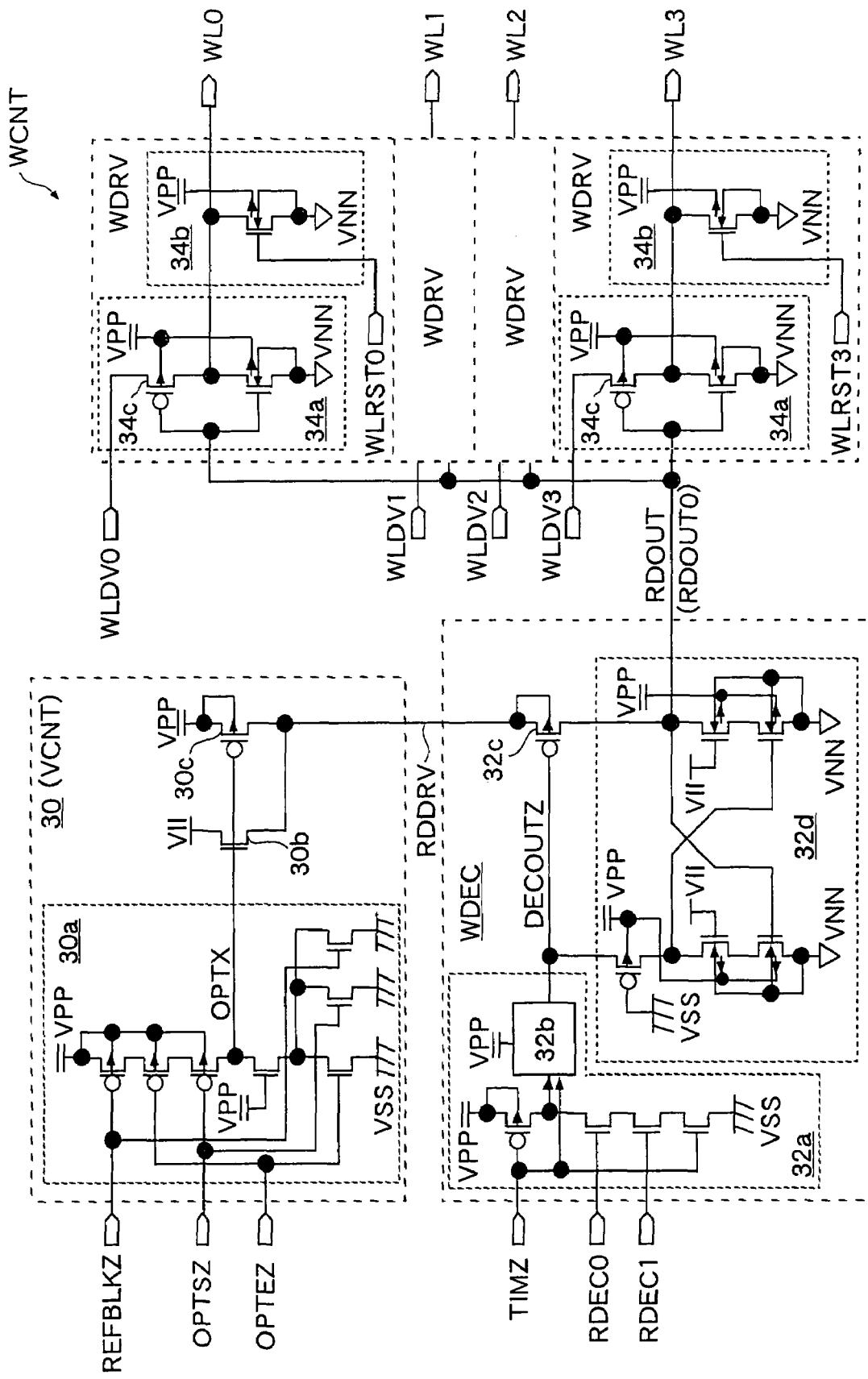
FIG. 5 is a circuit diagram showing the details of a gate control circuit, a word decoder, and a word driver shown in FIG. 4.

Each word control circuit WCNT has a voltage control circuit VCNT, a word decoder WDEC, a ¼ decoder QDEC, and word drivers WDRV. The voltage control circuit VCNT outputs a row driving voltage RDDRV (high level voltage) for a word control signal RDOUT used for the high level (activation level) of the word line WL to the word decoder WDEC. The details of the voltage control circuit VCNT are illustrated in FIG. 4 and FIG. 5.

The word decoder WDEC sets the word control signal RDOUT (word line control signal) to a selection level or an unselection level in accordance with a first address signal composed of higher order bits (however, the highest two bits used for the selection of the memory blocks BLK0-3 are excluded) of the internal row address signal IRA and the timing signal (for example, the WLZ signal) from the operation control circuit 24. The selection level is the negative voltage VNN. The unselection level is set to a first high voltage (for example, the boost voltage VPP) or a second high voltage (for example, the internal power supply voltage VII) in accordance with the voltage of the row driving signal RDDRV.

The ¼ decoder QDEC (the second word decoder) decodes a second address signal composed of the lower order two bits of the internal row address signal IRA and sets a decoded signal WLDV to the selection level (VPP) when the second address signal indicates selection in synchronization with the timing signal (for example, the WLZ signal) from the operation control circuit 24 and sets the decoded signal WLDV to the unselection level (VNN) when the second address signal indicates unselection.

The word driver WDRV sets the word line WL to the selection level (VPP) or the unselection level (VNN) in accordance with the word control signal RDOUT and the decoded signal WLDV.

Each of the memory blocks BLK0-3 has the same circuit configuration with one another, having the plurality of the dynamic memory cells MC arranged in a matrix, the plurality of the word lines WL and the plurality of bit line pairs BL, /BL connected to the memory cells MC. The memory cell MC is the same as the general memory cell of DRAM, having a capacitor (storage node) for holding data as charges and a transfer transistor arranged between the capacitor and the bit line BL (or /BL). The gate of the transfer transistor is connected to the word line WL.

The sense amplifier SA operates in synchronization with the latch enable signal LEZ and amplifies the voltage difference between the bit lines BL, /BL while the latch enable signal LEZ is being activated (during the period of high level). The precharge circuit PRE operates in synchronization with the bit line reset signal BRS and sets the bit lines BL, /BL to a predetermined voltage while the memory core 24 is not in operation.

The column decoder CDEC selects a column switch that connects the bit lines BL, /BL and a data line DT, respectively, in accordance with the column address signal CA and turns on the selected column switch in synchronization with the column control signal CLZ. The sense buffer SB amplifies the amount of signal of the read data on the data line DT at the time of read operation and outputs it to the common data bus CDB. The write amplifier WA amplifies the amount of signal of the write data on the common data bus CDB at the time of write operation and outputs it to the data line DT.

Figure 2:
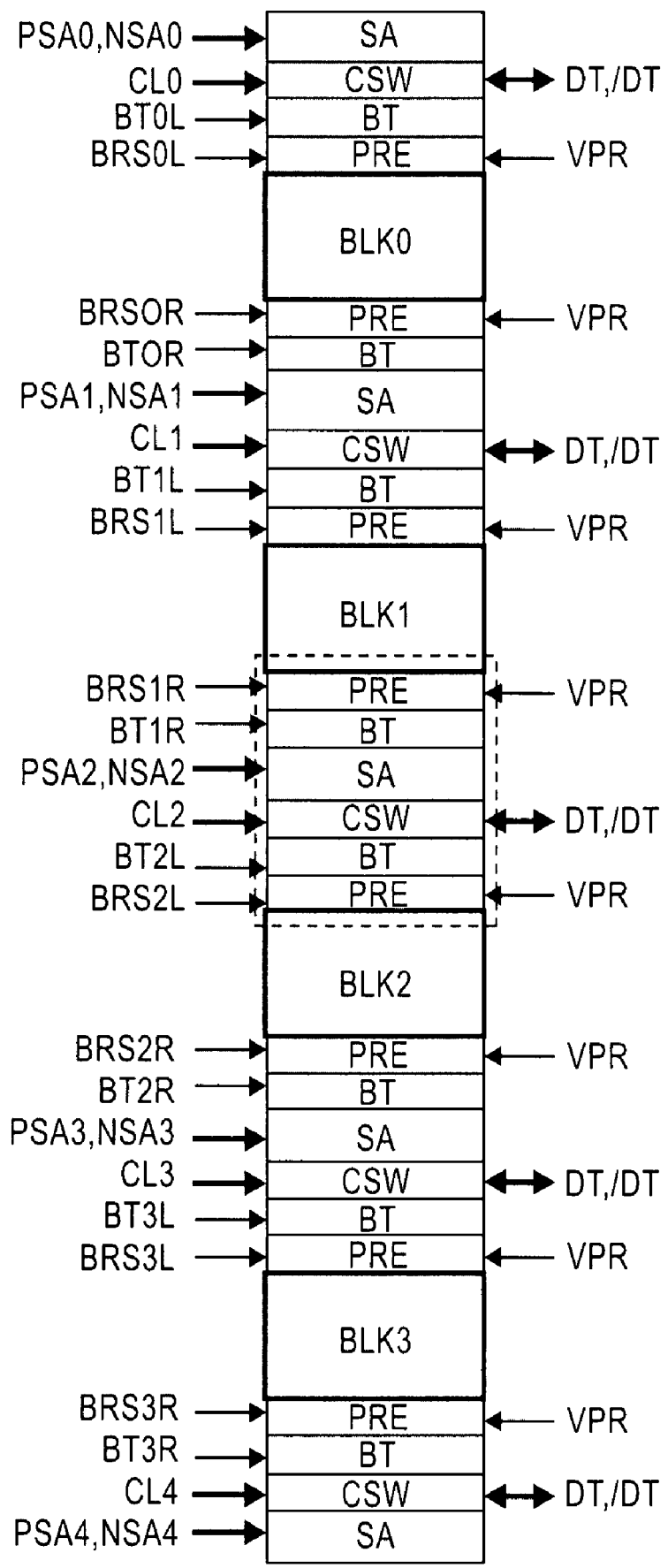
FIG. 2 is a block diagram showing the details of a memory block shown in FIG. 1.

FIG. 2 shows details of the memory blocks BLK0-3 shown in FIG. 1. The precharge circuit PRE, the connection switch BT, a column switch CSW, and the sense amplifier SA are arranged on both sides of each of the memory blocks BLK0-3. In other words, the sense amplifier SA arranged between a pair of memory blocks BLK (for example, BLK0-1) neighboring each other is shared by the pair of memory blocks BLK (shared sense amplifier system). By the way, the present invention can be applied to a semiconductor memory of a system in which the sense amplifier SA is formed for each of the memory blocks BLK0-3.

Each sense amplifier SA operates in synchronization with sense amplifier activation signals PSA, NSA (PSA0-4, NSA0-4). The sense amplifier activation signals PSA, NSA are signals that synchronize with the latch enable signal LEZ output from the operation control circuit 24 shown in FIG. 1. The signal lines of the sense amplifier activation signals PSA, NSA are wired for each block of the sense amplifier SA. Each column switch CSW connects the complementary outputs of the sense amplifier SA to the data lines DT, /DT in synchronization with the column switch signal CL (CL0-CL4). The signal line of the column switch CL is wired for each group of the column switch CSW corresponding to the number of bits of the data terminal DQ.

Each of the connection switches BT operates in synchronization with the switch control signal BT (BT0L-BT3L, BT0R-BT3R). The signal line of the switch control signal BT is wired for each block of the connection switches BT. Each of the precharge circuits PRE connects the bit lines BL and /BL to a precharge voltage line VPR in synchronization with the precharge control signal BRS (BRS0L-BRS3L, BRS0R-BRS3R). The signal line of the precharge control signal BRS is wired for each block of the precharge circuits PRE.

Figure 3:
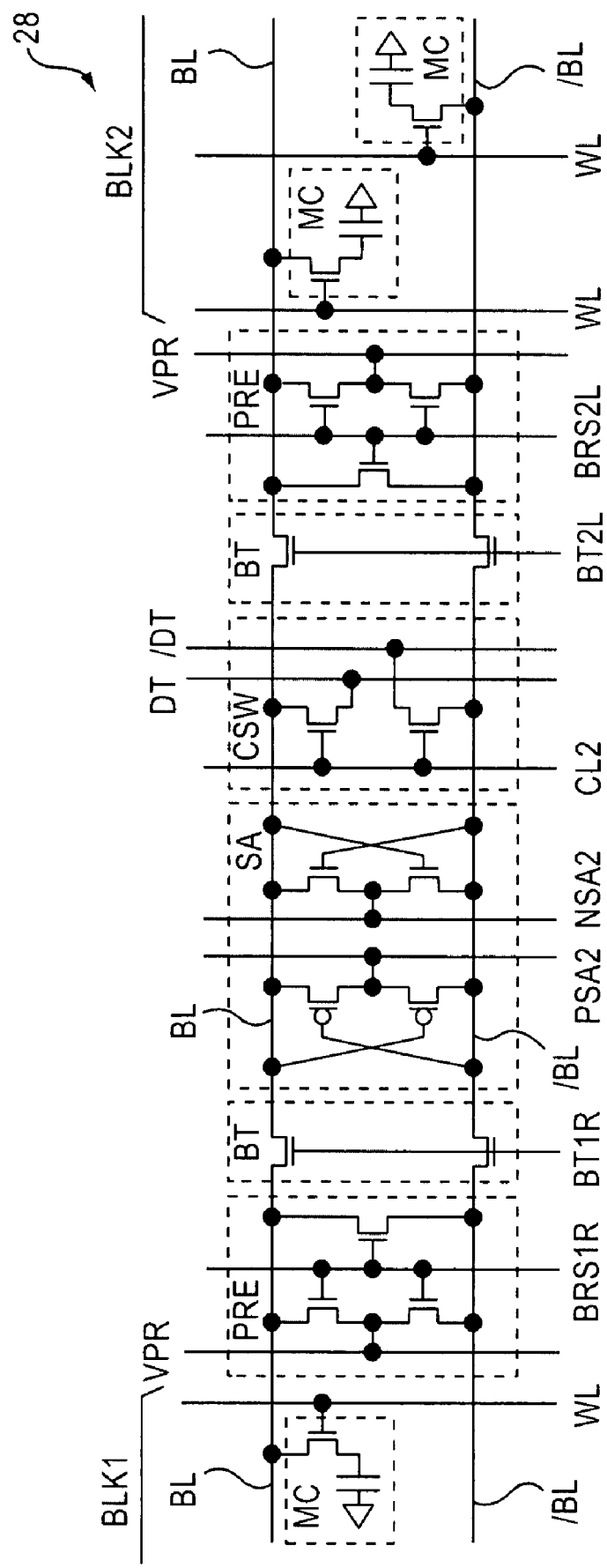
FIG. 3 is a circuit diagram showing the details of an area indicated by a dotted-lined frame in FIG. 2.

FIG. 3 shows the details of the area shown by a dotted-lined frame in FIG. 2. By the way, for convenience' sake, in FIG. 3, the data lines connected to the bit lines BL, /BL via the connection switch BT are also referred to as the bit lines BL, /BL. The memory cell MC connected to the word line WL is connected to one of the bit lines BL, /BL. Due to this, when the memory cell MC connected to the bit line BL is accessed, the bit line /BL functions as a reference voltage line (precharge voltage).

The connection switch BT is constituted by an nMOS transistor. One of the source/drain of the nMOS transistor is connected to the bit line BL (or /BL) and the other of the source/drain of the nMOS transistor is connected to the sense amplifier SA. The gate of the nMOS transistor receives the switch control signal (BT1R, BT2L). The connection switch BT connects the bit lines BL, /BL of the memory blocks BLK (BLK1-2) to the sense amplifier SA while receiving the high logic level switch control signal BT.

Each of the precharge circuits PRE is constituted by a pair of nMOS transistors for connecting the complementary bit lines BL, /BL to the precharge voltage lines VPR, respectively, and an nMOS transistor for connecting the bit lines BL, /BL to each other. The gate of the nMOS transistor of the precharge circuit PRE receives the precharge control signal BRS (BRS1R, BRS2L). The precharge circuit PRE supplies the precharge voltage VPR to the bit lines BL, /BL and equalizes the voltage of the bit lines BL, /BL while receiving the high logic level precharge control signal BRS.

The sense amplifier SA is constituted by a pair of CMOS inverters the input and output of which are connected to each other. The input (the gate of the transistor) of each CMOS converter is connected to the bit line BL (or /BL). Each CMOS inverter is constituted by an nMOS transistor and a pMOS transistor arranged side by side in the transverse direction in the figure. The source of the pMOS transistor of each CMOS inverter receives the sense amplifier activation signal PSA (PSA2). The source of the nMOS transistor of each CMOS inverter receives the sense amplifier activation signal NSA (NSA2). The sense amplifier activation signal PSA is set to a high level voltage when the sense amplifier SA operates and is set to the precharge voltage VPR when the sense amplifier SA does not operate. The sense amplifier activation signal NSA is set to a low level voltage (for example, the ground voltage) when the sense amplifier SA operates and is set to the precharge voltage VPR when the sense amplifier SA does not operate.

The column switch CSW is constituted by an nMOS transistor that connects the bit line BL to the data line DT and an nMOS transistor that connects the bit line /BL to the data line /DT. The gate of each nMOS transistor receives the column switch signal CL (CL2). During the read operation, the read data signal on the bit lines BL, /BL amplified by the sense amplifier SA is transmitted to the data lines DT, /DT via the column switch CSW. During the write operation, the write data signal to be supplied via the data lines DT, /DT is written to the memory cell MC via the bit lines BL, /BL. The data lines DT, /DT are connected to the read amplifier RA and the write amplifier WA.

FIG. 4 shows the outline of the word control circuit WCNT shown in FIG. 1. The voltage control circuit VCNT has a timing control circuit 29 and a gate control circuit 30. The details of the gate control circuit 30, the word decoder WDEC, and the word driver WDRV are illustrated in FIG. 5.

When detecting that the corresponding memory block BLK is accessed in accordance with the row address signal IRA, the timing control circuit 29 outputs an operation start signal OPTSZ and an operation end signal OPTEZ in synchronization with the basic timing signal RASZ. When other memory blocks BLK are accessed, the operation start signal OPTS or the operation end signal OPTEZ is not output.

The gate control circuit 30 sets the voltage of the row driving signal RDDRV (RDDRV0-3) to the boost voltage VPP in accordance with the operation start signal OPTSZ and the operation end signal OPTEZ. The numbers of the row driving signals RDDRV0-3 correspond to the numbers of the memory blocks BLK0-3. In addition, when detecting that the corresponding memory block BLK is the refresh block REFBLK that performs the refresh operation in accordance with the refresh address signal RFA, the gate control circuit 30 sets the voltage of the row driving signal RDDRV to the boost voltage VPP. In a state other than the above, the gate control circuit 30 sets the voltage of the row driving signal RDDRV to, for example, the internal power supply voltage VII.

Each word control circuit WCNT has, for example, 64 word decoders WDEC and 256 word drivers WDRV. In other words, the four word drivers WDRV are formed corresponding to each word decoder WDEC. The word driver WDRV is formed corresponding to each of the 256 word lines WL (WL0, WL1, ..., WL255). During the read operation, the write operation, or the refresh operation, any one of the word decoders WDEC is selected for each data terminal DQ in accordance with the row address signal IRA. The selected word decoder WDEC sets the word control signal RDOUT to the negative voltage VNN. The word decoder WDEC not selected sets the word control signal RDOUT to the boost voltage VPP.

The ¼ decoder QDEC changes any one of the decoded signals WLDV (WLDV0-3) from the negative voltage VNN to the boost voltage VPP in accordance with the lower two bits (second address signal) of the row address signal RA. The four decoded signals WLDV are output commonly to the plurality of the word drivers WDRV in the word control circuit WCNT. Among the four word drivers WDRV that receive the word control signal RDOUT of the negative voltage VNN, the word driver WDRV that receives the decoded signal WLDV set to the boost level VPP sets the word line WL to the boost voltage VPP. In other words, in accordance with the row address signal RA, one word driver WDRV activates for each data terminal DQ and one word line WL is selected. Then, the capacitor of the memory cell MC and the bit line BL (or /BL) are connected and the read operation, the write operation, or the refresh operation is performed.

FIG. 5 shows the details of the gate control circuit 30, the word decoder WDEC, and the word driver WDRV. In the figure, the connection destination of the arrow attached to the transistor shows the voltage of the well region. The nMOS transistor with two arrows in the opposite directions with each other has a triple well structure. The substrate voltage (the voltage of the well region) of the nMOS transistor without an arrow is set to the ground voltage VSS.

The gate control circuit 30 has a NOR circuit 30a, an nMOS transistor 30b, and a PMOS transistor 30c. The NOR circuit 30a outputs an operation signal OPTX at the low level (VSS) when any one of the operation start signal OPTSZ, the operation end signal OPTEZ, and the refresh block signal REFBLKZ is at the high level (Vll). In addition, the NOR circuit 30a outputs the operation signal OPTX at the high level (VPP) when all of the operation start signal OPTSZ, the operation end signal OPTEZ, and the refresh block signal REFBLKZ are at the high level (VPP).

The refresh block signal REFBLKZ is generated by an address decoder, not shown, which decodes the refresh address signal RFA. The refresh block signal REFBLKZ is activated when the corresponding memory block BLK is the refresh block REFBLK that performs the refresh operation.

The nMOS transistor 30b outputs the row driving signal RDDRV at the high level (VII) when the operation signal OPTX is at the high level (VPP). The pMOS transistor 30c outputs the row driving signal RDDRV at the high level (VPP) when the operation signal OPTX is at the low level (VSS). The high level voltage of the word line WL is set by the voltage of the row driving signal RDDRV.

In this manner, the gate control circuit 30 (the voltage control circuit VCNT) connects the high level voltage line RDDRV to supply the high level voltage for the word control signal RDOUT to the word decoder WDEC to the boost voltage line VPP (first high voltage line) to which the boost voltage VPP (first high voltage) is supplied during the access period of the corresponding memory block BLK. In addition, the gate control circuit 30 connects the high level voltage line RDDRV to the internal power supply line VII (second high voltage line) to which, for example, the internal power supply voltage VII (second high voltage) lower than the boost voltage VPP is supplied during the access period of other memory blocks BLK (first operation).

By the way, when the boost voltage VPP is supplied to the gate of the pMOS transistor 30c, the drain of the PMOS transistor 30c and the substrate are set to the internal power supply voltage VII and the boost voltage VPP, respectively, and the voltage difference between the substrate and the drain is small. Due to this, a gate induced drain current GIDL hardly flows. Consequently, no measure for the GIDL as to the pMOS transistor 30c is necessary.

The word decoder WDEC has a decode part 32a in which a pMOS transistor and an nMOS transistor are connected in series between the boost voltage line VPP and the ground line VSS and which decodes the row address signal RA, a latch 32b connected to the output of the decode part 32a, a pMOS transistor 32c to the gate of which an output node DECOUTZ of the latch 32b is connected, and a level conversion part 32d connected to the output node DECOUTZ and the drain of the pMOS transistor 32c. The latch 32b has a function of reversing the level of an input signal. The pMOS transistor 32c sets the level of the word control signal RDOUT to the internal power supply voltage VII or the boost voltage VPP when the output node DECOUTZ is at the low level. The level conversion part 32d sets the level of the word control signal RDOUT to the negative voltage VNN when the output node DECOUTZ is at the high level (VPP).

The decode part 32a outputs a word control signal RDOUTZ in accordance with a predecode signal RDEC (RDEC0-1) of the row address signal RA (first address signal) and a timing signal TIMZ. Here, the access period is a period during which the read operation, the write operation, or the refresh operation is performed. Specifically, the decode part 32a is activated in synchronization with the high level period of the timing signal TIMZ and sets the output node DECOUTZ to the high level (VPP) when all of the predecode signals RDEC are at the high level, that is, the row address signal RA shows selection. At this time, the word decoder WDEC sets the word control signal RDOUT to the negative voltage VNN (low level voltage). The timing signal TIMZ is, for example, a signal that synchronizes with the word control signal WLZ.

In addition, the decode part 32a maintains the output node DECOUTZ at the low level (VSS) when any one of the predecode signals RDEC is at the low level, that is, the row address signal RA shows unselection during the access period. At this time, the word decoder WDEC of the three memory blocks BLK other than one memory block BLK that functions as the refresh block REFBLK sets the word control signal RDOUT to the internal power supply voltage VII (high level voltage). The word decoder WDEC of the refresh block REFBLK sets the word control signal RDOUT to the boost voltage VPP (high level voltage).

On the other hand, during the periods other than the access period, the output node DECOUTZ of all of the decode parts 32a is maintained at the low level (VSS). At this time, the word decoder WDEC of the three memory blocks BLK other than the refresh block REFBLK sets the word control signal RDOUT to the internal power supply voltage VII (high level voltage) as same as the voltage of the row driving signal RDDRV. The word decoder WDEC of the refresh block REFBLK sets the word control signal RDOUT to the boost voltage VPP (high level voltage) as same as the voltage of the row driving signal RDDRV. During the standby period, the gate of the PMOS transistor 32c receives the ground voltage VSS. Consequently, no measure for the GIDL as to the pMOS transistor 32c is necessary.

The word driver WDRV has a CMOS inverter 34a that outputs the high level (VPP level or VII level of the decoded signal WLDV) or the low level (VNN) to the word line WL (WL0-3) and an nMOS transistor 34b that connects the word line WL to the negative voltage line VNN in accordance with a word reset signal WLRST (WLRST0-3). The word driver WDRV activates the level of the word line WL connected to the drain (output) of the p MOS transistor 34c to the boost voltage VPP (high level voltage) when receiving the word control signal RDOUT of the negative voltage VNN (low level voltage) at the gate of the pMOS transistor 34c and inactivates the level of the word line WL to the negative voltage VNN (low level voltage) when receiving the word control signal RDOUT of the boost voltage VPP or the internal power supply voltage VII at the gate.

The level of the word line WL is held at the unselection level (VNN) while the word reset signal WLRST is at the high level (VII). The word reset signal WLRST is a signal having a phase opposite to that of the decoded signal WLDV and is generated respectively in the word driver WDRV.

Figure 6:
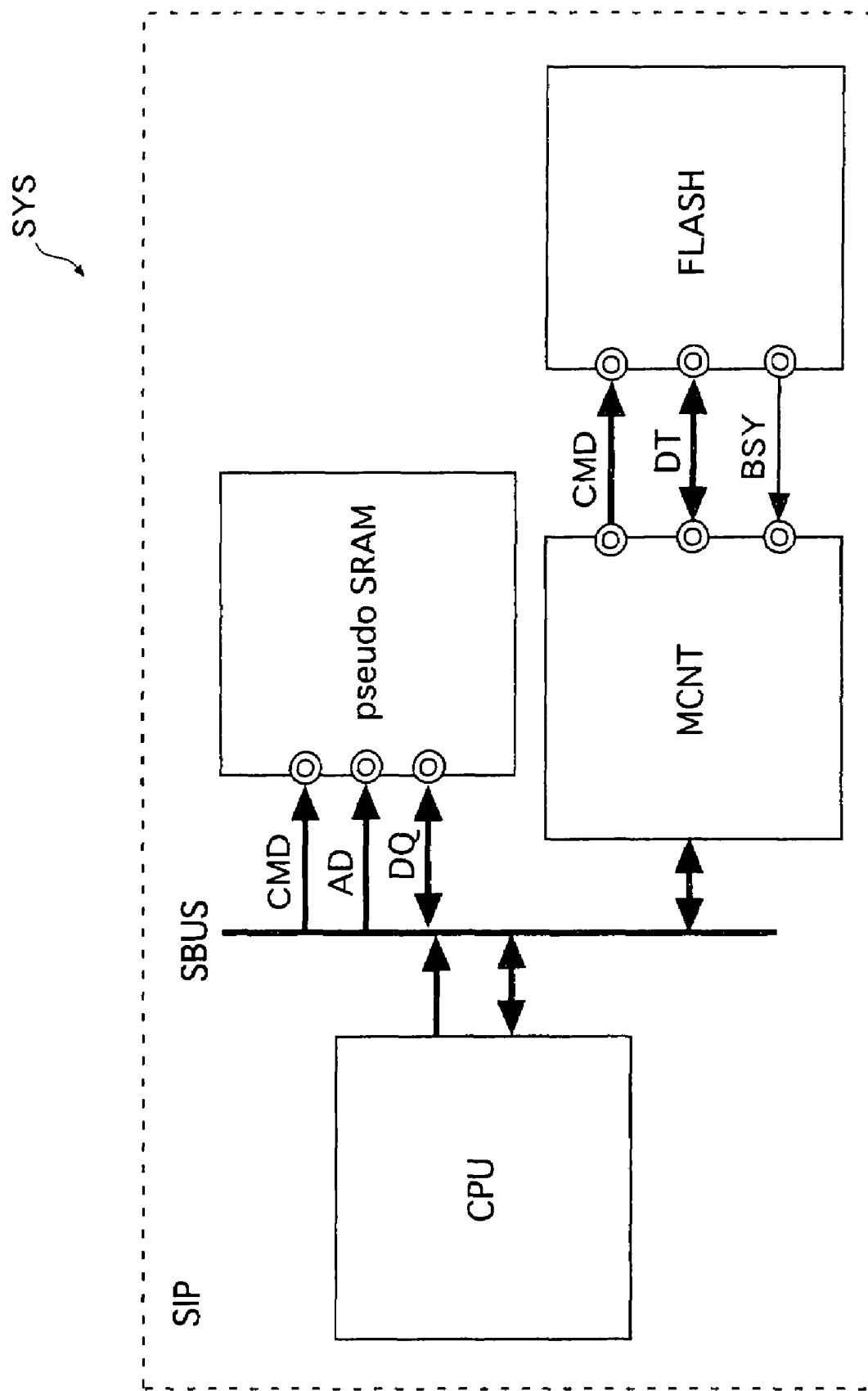
FIG. 6 is a block diagram showing a system in the first embodiment.

FIG. 6 shows a system SYS in the first embodiment. By the way, also in embodiments to be described later, the same system as that in FIG. 6 is configured. The system SYS is formed as, for example, a system in package SiP (System in Package) integrated on a silicon substrate. The SiP has the pseudo SRAM shown in FIG. 1, a flash memory FLASH, a memory controller MCNT that accesses the flash memory FLASH, and a CPU (controller) that controls the entire system. The CPU, the pseudo SRAM, and the memory controller MCNT are connected to one another by a system bus SBUS. The SiP may be connected to a higher rank system via an external bus. The CPU outputs the command signal CMD, an address signal ADD, and the write data signal DQ in order to access the pseudo SRAM and receives the read data signal DQ from the pseudo SRAM.

Figure 7:
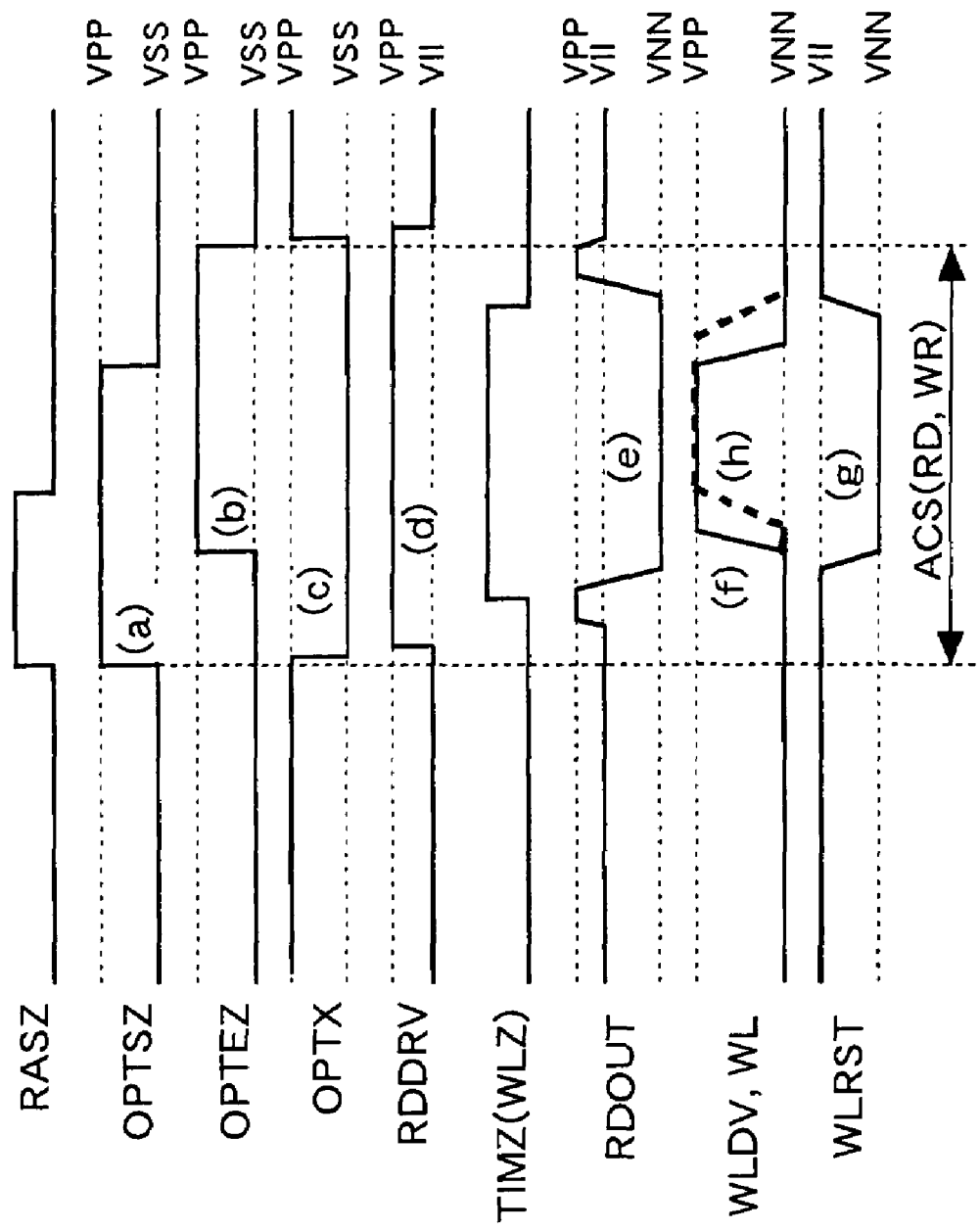
FIG. 7 is a timing chart showing the operation of the word control circuit corresponding to a memory block in which a read operation or a write operation is performed.

FIG. 7 shows the operation of the word control circuit WCNT corresponding to the memory block BLK (selection block) in which the read operation or the write operation is performed. Since the memory block BLK is not the refresh block REFBLK, the refresh operation is not performed.

First, the timing control circuit 29 shown in FIG. 4 outputs the operation start signal OPTSZ and the operation end signal OPTEZ, respectively, in synchronization with the basic timing signal RASZ (FIG. 7(a, b)). The rising edge of the operation start signal OPTSZ shows the start of an access period ACS and the falling edge of the operation end signal OPTEZ shows the end of the access period ACS. The operation start signal OPTSZ and the operation end signal OPTEZ are signals the high level period of which overlaps each other. The access period ACS is a period during which the read operation RD, the write operation WR, or the refresh operation REF (FIG. 9) is performed.

In the memory blocks BLK other than the refresh block REFBLK, the operation signal OPTX is activated to the low level during the high level period of the operation start signal OPTSZ or the operation end signal OPTEZ (FIG. 7(c)). The row driving signal RDDRV is set to the internal power supply voltage VII while the operation signal OPTX is inactivated and is set to the boost voltage VPP while the operation signal OPTX is activated (FIG. 7(d)).

The word decoder WDEC corresponding to the word line WL to be accessed sets the word control signal RDOUT to the low level (VNN) in synchronization with the timing signal TIMZ (FIG. 7(e)). Because of this, the word control signal RDOUT corresponding to the word line WL to be accessed changes to the boost voltage VPP at the start and the end of the access period ACS and is maintained at the negative voltage VNN during the access period ACS.

The ¼ decoder QDEC changes one of the decoded signals WLDV (for example, WLDV0) corresponding to the lower two bits of the internal row address signal IRA from the low level (VNN) to the high level (VPP) (FIG. 7(f)). The word driver WDRV that receives the high level decoded signal WLDV inactivates the word reset signal WLRST in synchronization with the decoded signal WLDV (FIG. 7(g)). Among the four word drivers WDRV that receive the low level word control circuit RDOUT, the word driver WDRV that receives the high level (VPP) decoded signal WLDV changes the word line WL (for example, WL0) to the boost voltage VPP in synchronization with the decoded signal WLDV as shown by the thick dotted line in the figure. Due to this, the access operation (the read operation or the write operation) is performed. By the way, although not shown schematically in particular, among the four word drivers WDRV that receive the low level word control signal RDOUT, the three word drivers WDRV that receive the low level decoded signal WLDV hold the word reset signal WLRST at the high level and hold the word line WL at the negative voltage VNN. Because of this, the access operation is not performed.

When the word driver WDRV operates in order to perform the read operation or the write operation, the period during which the gate of the pMOS transistor 34c (FIG. 5) receives the boost voltage VPP is short. Because of this, the GIDL current that flows through the pMOS transistor 34c of the selection block is extremely small.

Figure 8:
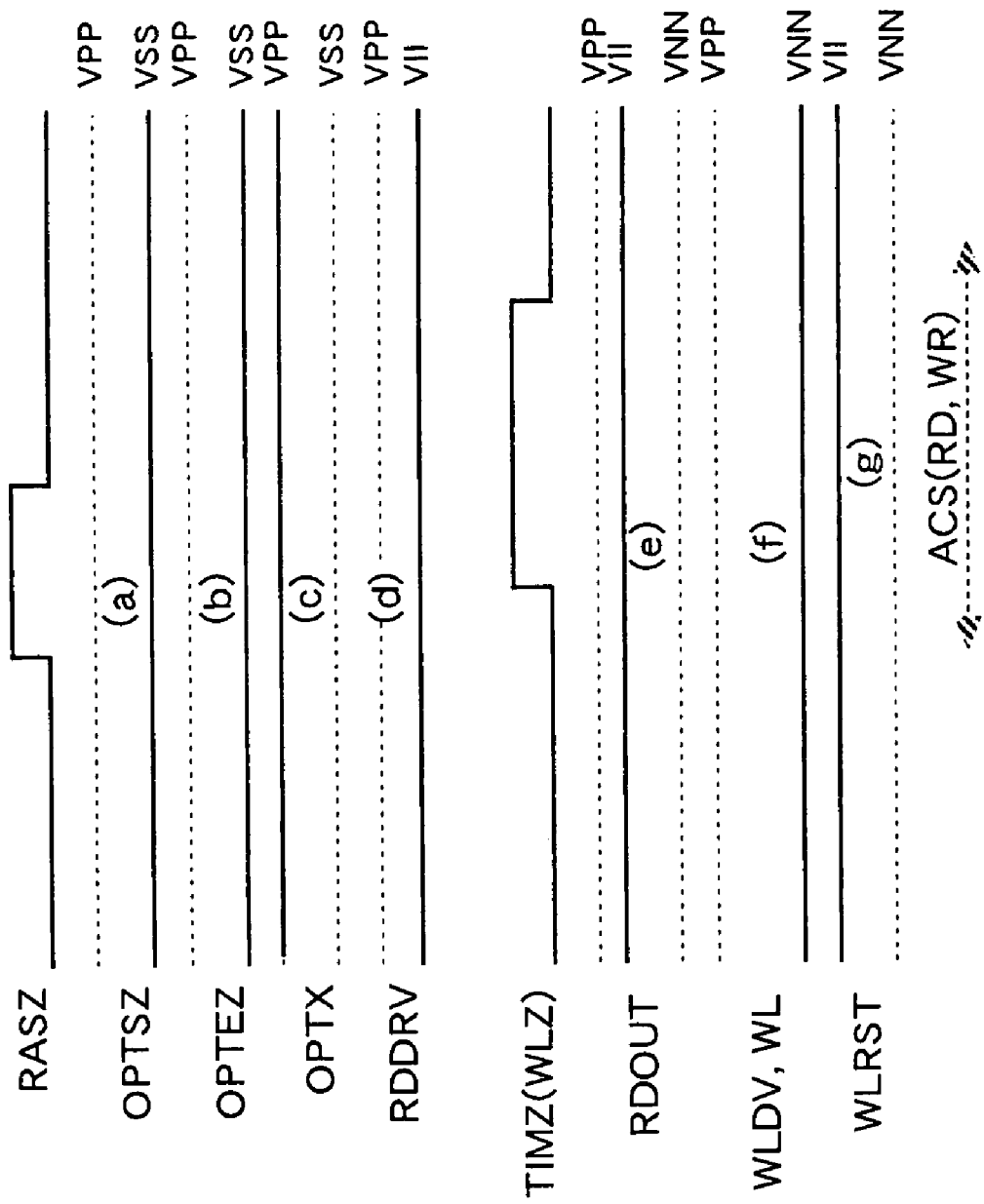
FIG. 8 is a timing chart showing the operation of the word control circuit corresponding to a memory block BLK in which the read operation or the write operation is not performed.

FIG. 8 shows the operation of the word control circuit WCNT corresponding to the memory block BLK (unselection block) in which the read operation or the write operation is not performed. Since this memory block BLK is not the refresh block REFBLK, the refresh operation is not performed. The detailed description of the same operation as that in FIG. 7 is omitted. The access period ACS shown by the dotted line shows the access operation of other memory blocks.

In the word control circuit WCNT corresponding to the unselection block, the operation start signal OPTSZ and the operation end signal OPTEZ are held at the low level (FIG. 8(a, b)). Because of this, the operation signal OPTX is held at the high level (FIG. 8 (c)) and the row driving signal RDDRV is set to the internal power supply voltage VII (FIG. 8(d)).

The word decoder WDEC holds the word control signal RDOUT at the same high level (VII) as that of the row driving signal RDDRV (FIG. 8(e)). The word driver WDRV holds the word line WL at the low level (VNN) (FIG. 8(f)) and holds the word reset signal WLRST at the high level (FIG. 8(g)). In this manner, in the unselection block, the gate of the pMOS transistor 34c (FIG. 5) always receives the internal power supply voltage VII. Because of this, the GIDL current hardly flows through the pMOS transistor 34c of the unselection block. Further, in the unselection block, since the level of the operation signal OPTX does not change, the voltage of the high level voltage line RDDRV that transmits the row driving signal RDDRV does not change. In other words, in the memory block BLK not to be accessed, it is possible to prevent charges from being charged/discharged to/from the high level voltage line RDDRV. Since the GIDL current is reduced and the charging/discharging current of the high level voltage line RDDRV is reduced, it is possible to reduce the current consumption of the pseudo SRAM.

Figure 9:
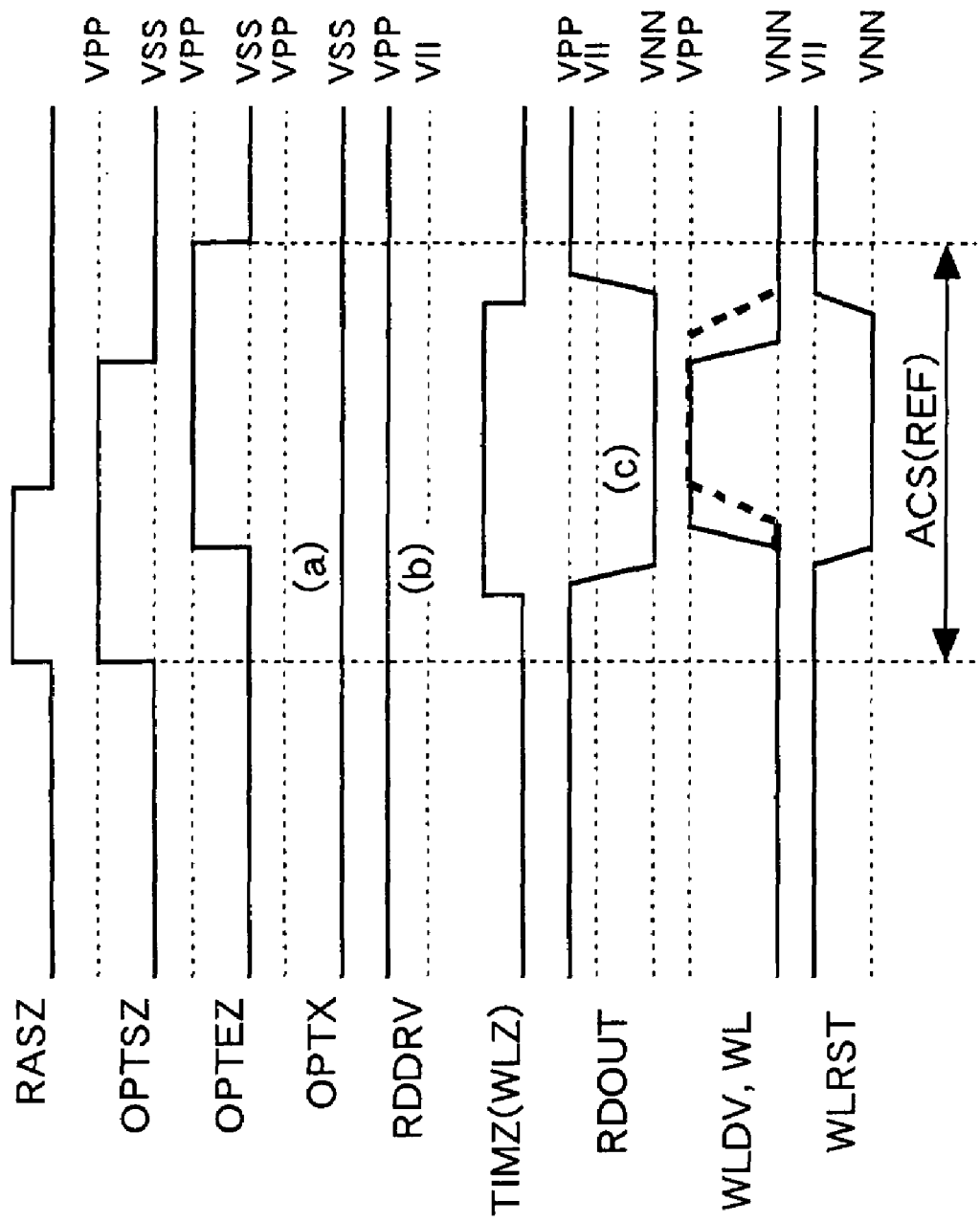
FIG. 9 is a timing chart showing the operation of the word control circuit corresponding to a refresh block in which a refresh operation is performed.

FIG. 9 shows the operation of the word control circuit WCNT corresponding to the memory block BLK (refresh block REFBLK) in which the refresh operation is performed. The detailed explanation of the same operation as that in FIG. 7 is omitted. By the way, the operation of the memory blocks BLK (unselection block) other than the refresh block REFBLK is the same as that in FIG. 8.

In the gate control circuit 30 (FIG. 5) corresponding to the refresh block REFBLK, irrespective of the level of the operation start signal OPTSZ and the operation end signal OPTEZ, the operation signal OPTX is held at the low level in accordance with the high level refresh block signal REFBLKZ (FIG. 9(a)). Because of this, the row driving signal RDDRV is always set to the boost voltage VPP (FIG. 9(b)). In other words, in the present embodiment, the row driving signal RDDRV is prevented from changing from the internal power supply voltage VII to the boost voltage VPP in synchronization with the start of the refresh operation REF. In addition, the row driving signal RDDRV is prevented from changing from the boost voltage VPP to the internal power supply voltage VII in synchronization with the end of the refresh operation REF.

Due to this, accompanying the refresh operation REF, it is possible to prevent the row driving signal line RDDRV from being charged or discharged. In contrast to this, conventionally, the row driving signal line RDDRV used to be wired commonly to all of the memory blocks. Because of this, the charging/discharging current that occurs in the row driving signal line RDDRV for each refresh operation REF used to be relatively large.

The word decoder WDEC corresponding to the word line WL to be accessed for the refresh operation sets the word control signal RDOUT to the low level (VNN) in synchronization with the timing signal TIMZ (FIG. 9(c)). Because of this, the word control signal RDOUT corresponding to the word line WL to be accessed is maintained at the low level (VNN) during the access period ACS. The waveforms of the decoded signal WLDV, the word line WL, and the word reset signal WLRST are the same as those in FIG. 7.

In the refresh block REFBLK in which the refresh operation REF is performed, the gate of the pMOS transistor 34c (FIG. 5) receives the boost voltage VPP while the refresh operation REF is not performed. Because of this, substantially the same amount of the GIDL current as the conventional amount flows through the pMOS transistor 34c of the refresh block REFBLK. However, in the three memory blocks BLK other than the refresh block REFBLK, the row driving signal line RDDRV is set to the internal power supply voltage VII as shown in FIG. 8. Because of this, the GIDL current hardly flows through the pMOS transistor 34c. Further, since the voltages of the row driving signal line RDDRV are switched only in the refresh block REFBLK, the charge/discharge current that flows through the row driving signal line RDDRV decreases. As a result, it is possible to reduce the current consumption (standby current) of a self-refresh period SREF (standby period STBY) in which only the refresh operation REF is performed periodically.

Figure 10:
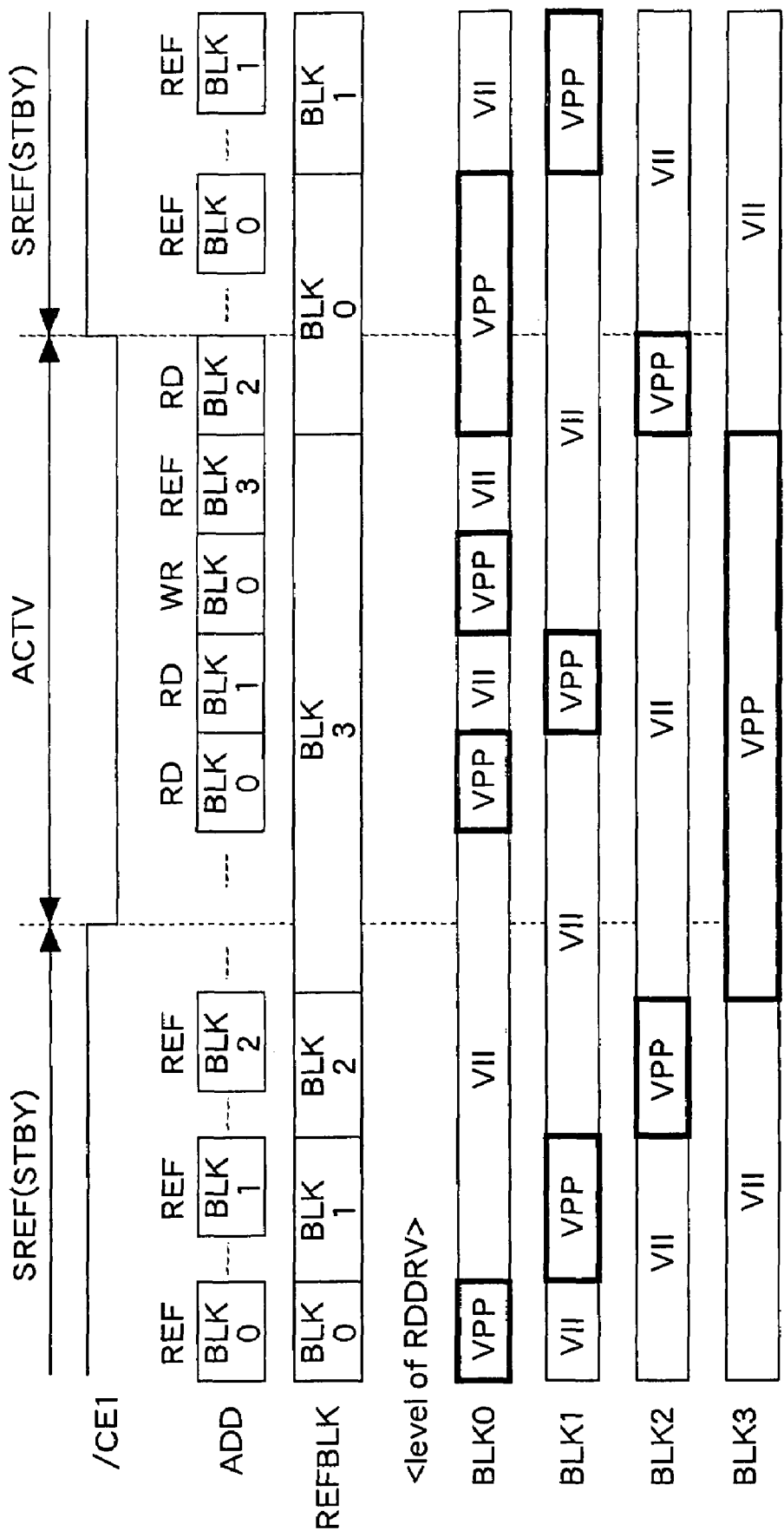
FIG. 10 is an explanatory diagram showing the outline of the operation in the first embodiment.

FIG. 10 shows the outline of the operation in the first embodiment. In this example, the operation mode is switched from the self-refresh mode SREF (standby mode STBY) to the active mode ACTV and is switched again to the self-refresh mode SREF. The operation modes are switched by a chip enable signal /CE1. In the following description, the period during which the chip enable signal /CE1 is at the high level is also referred to as the self-refresh period SREF and the period during which the chip enable signal /CE1 is at the low level is also referred to as the activation period ACTV. In the figure, the rectangular frames of BLK0-3 shown on the right side of the address signal ADD show the memory block BLK in which the access operation (REF, RD, or WR) is performed.

During the self-refresh period SREF, only the refresh operation REF is performed automatically. During the activation period ACTV, the read operation and the write operation are performed respectively in response to the read command RD and the write command WR. In addition, during the activation period ACTV, the refresh operation REF is also performed.

The memory blocks BLK0-3 are switched sequentially to the refresh block REFBLK in which the refresh operation REF is performed. The refresh block REFBLK may be switched for each refresh operation REF (FIG. 11) or may be switched for a predetermined number of times of the refresh operation REF (FIG. 12).

The row driving signal line RDDRV in each of the memory blocks BLK0-3 is set to the internal power supply voltage VII except for the access period (RD, WR, REF) while not being the refresh block REFBLK. In other words, the gate control circuit 30 of the voltage control circuit VCNT corresponding to the memory block BLK, which is not the refresh block REFBLK, performs the first operation for connecting the row driving signal line RDDRV to the boost voltage line VPP during the access period of the corresponding memory block BLK and connecting it to the internal power supply voltage line VII during the non-access period of the corresponding memory block BLK.

In addition, the row driving signal line RDDRV of each of the memory blocks BLK0-3 is set to the boost voltage VPP in the refresh block REFBLK. In other words, the gate control circuit 30 of the voltage control circuit VCNT corresponding to the refresh block REFBLK performs a second operation for continuing the connection of the row driving signal line RDDRV with the boost power supply line VPP. In the figure, the voltage control circuits VCNT corresponding to the memory blocks BLK0-2 perform the first operation and the voltage control circuit VCNT corresponding to the memory block BLK3 performs the second operation.

During the self-refresh period SREF, the timings of switching of the level of the row driving signal line RDDRV are only when set to the refresh block REFBLK and when released from the refresh block REFBLK. Because of this, the frequency of occurrence of a charge/discharge current through the row driving signal line RDDRV is low.

During the activation period ACTV, when the read operation RD or the write operation WR is performed, the row driving signal line RDDRV of the corresponding memory block BLK changes from the internal power supply voltage VII to the boost voltage VPP only during the access period. However, in the refresh block REFBLK, the row driving signal line RDDRV is fixed to the boost voltage VPP.

Figure 11:
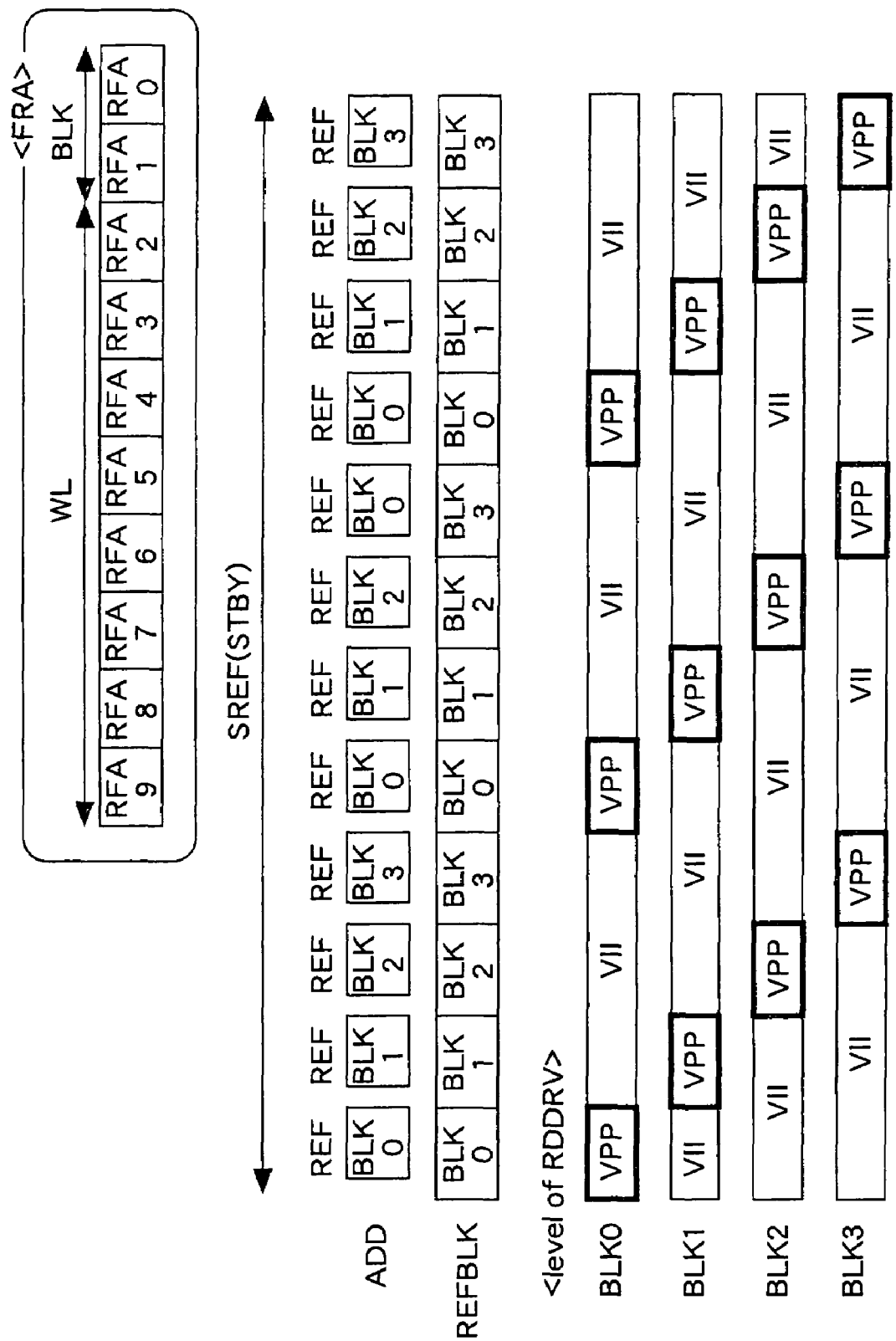
FIG. 11 is an explanatory diagram showing an example of the operation during a self-refresh period in the first embodiment.
Figure 12:
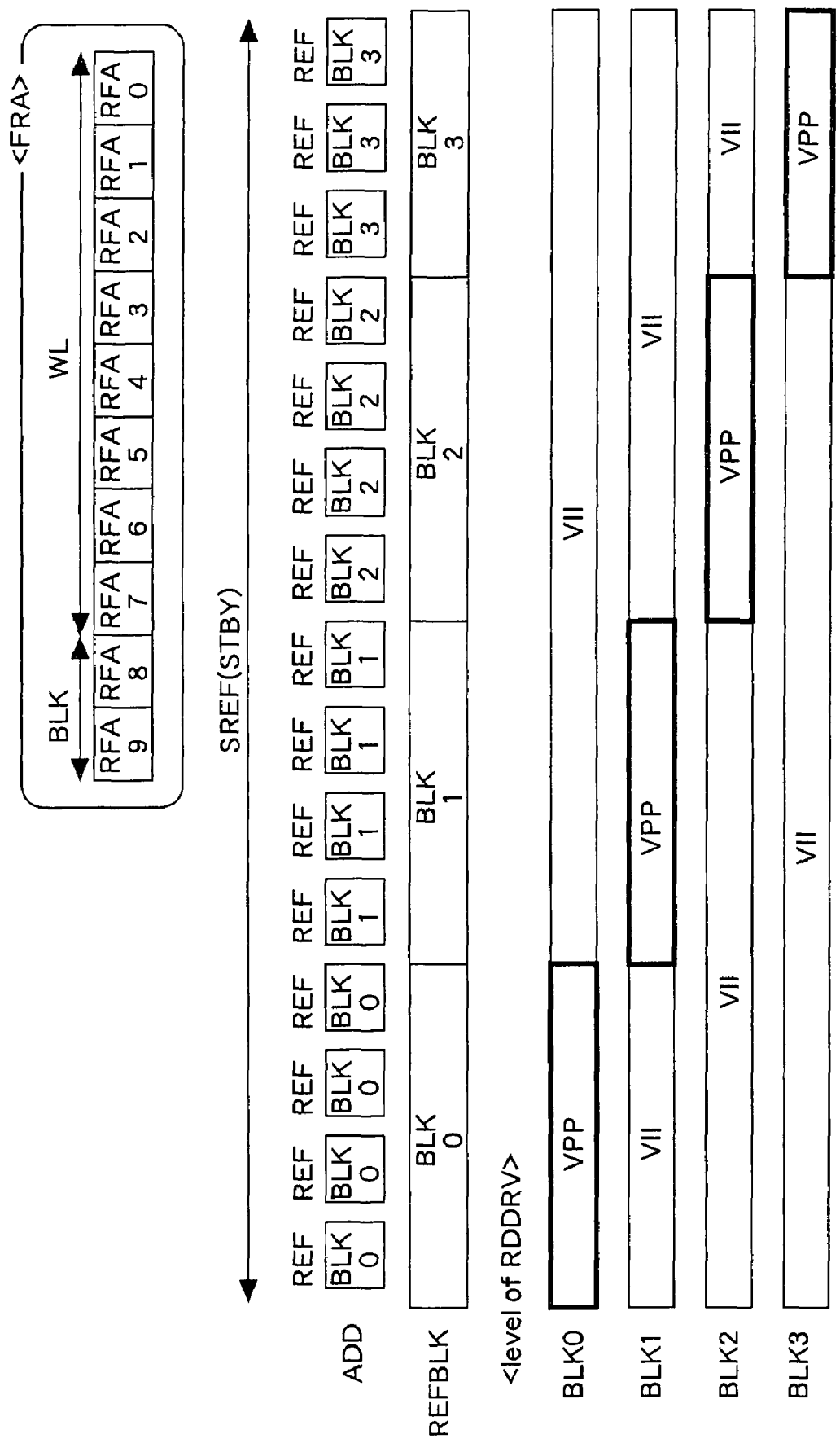
FIG. 12 is an explanatory diagram showing another example of the operation during the self-refresh period in the first embodiment.

FIG. 11 shows an example of the operation during the self-refresh period SREF in the first embodiment. In this example, the refresh address counter that generates the refresh address RFA indicates the memory block BLK by the lower two bits RFA0-1 and indicates the word line WL by the upper eight bits RFA2-9. Because of this, the refresh block REFBLK is sequentially switched to the memory blocks BLK0-3 for each refresh operation REF.

FIG. 12 shows another example of the operation during the self-refresh period SREF in the first embodiment. In this example, the refresh address counter indicates the word line WL by the lower eight bits RFA0-7 and indicates the memory block BLK by the upper two bits RFA8-9. Because of this, the refresh block REFBLK is switched to another sequentially each time all of the word lines WL of the respective memory blocks BLK0-3 are selected by the refresh operation REF. By the way, in FIG. 15, description will be given on the assumption that the refresh address RFA indicative of the word line WL includes only the lower two bits RFA 0-1. In other words, each of the memory blocks BLK0-3 has the four word lines WL.

As shown in FIG. 12, by assigning bits for selecting the memory blocks BLK0-3 to the upper portion of the refresh address RFA, it is possible to reduce the frequency of switching of the level of the row driving signal line RDDRV to VPP or VII. Due to this, it is possible to further reduce the standby current during the self-refresh period SREF.

Figure 13:
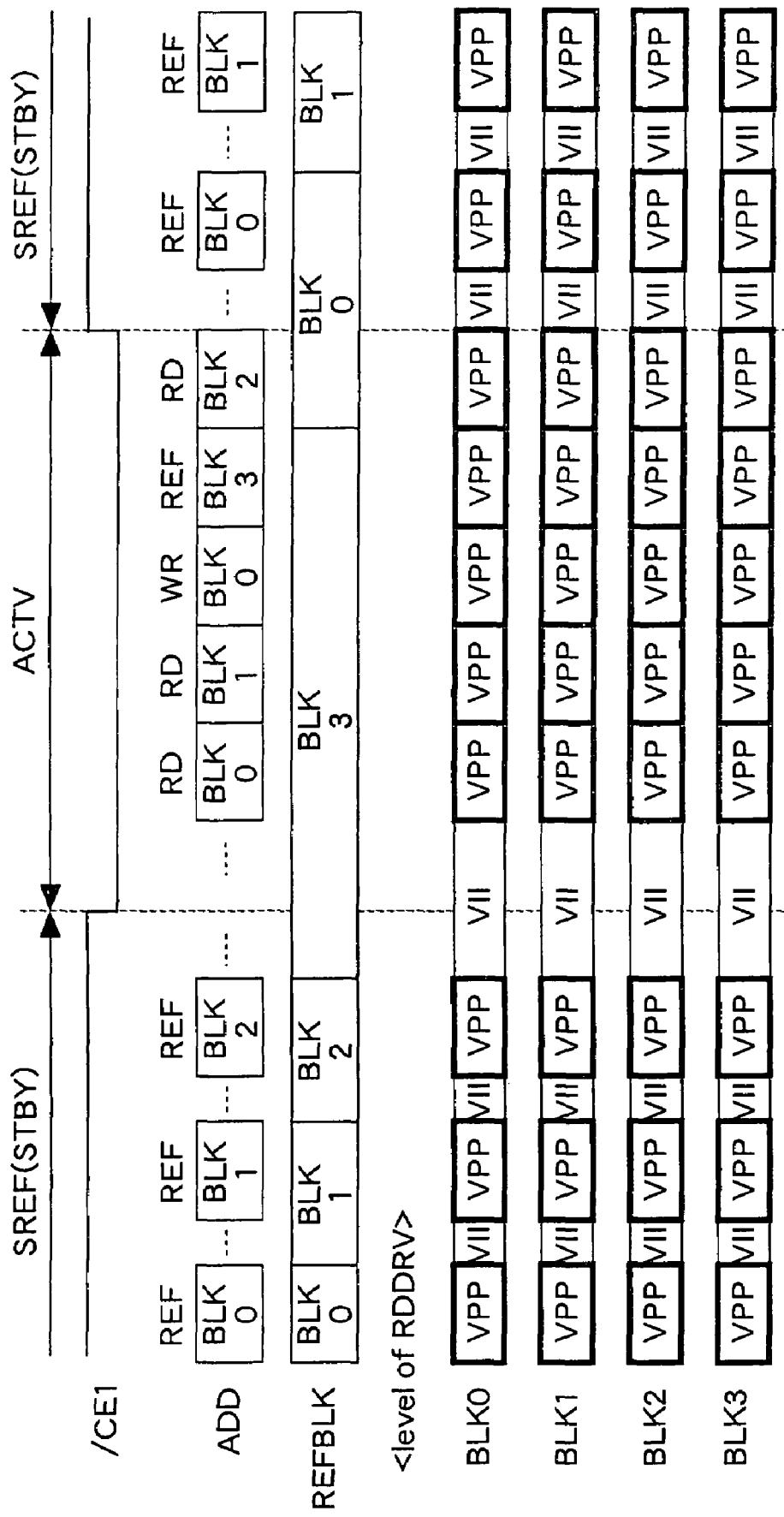
FIG. 13 is an explanatory diagram showing the operation before the present invention is applied.

FIG. 13 shows the operation before the present invention is applied. The operation in FIG. 13 corresponds to the operation in FIG. 10. Before the present invention, the row driving signal line RDDRV was wired commonly to the memory blocks BLK0-3. Because of this, when any one of the memory blocks BLK0-3 was accessed (RD, WD, or REF), the row driving signals RDDRV of all of the memory blocks BLK0-3 were switched from the internal power supply voltage VII to the boost voltage VPP. Because of this, the charge/discharge current that occurs through the row driving signal line RDDRV is larger compared to that in FIG. 10. In FIG. 10 and FIG. 13, if it is assumed that the number of rectangular frames of VPP indicates the number of times of charge/discharge, it is possible to reduce the number of times of charge/discharge to one-fourth by the application of the present invention.

Figure 14:
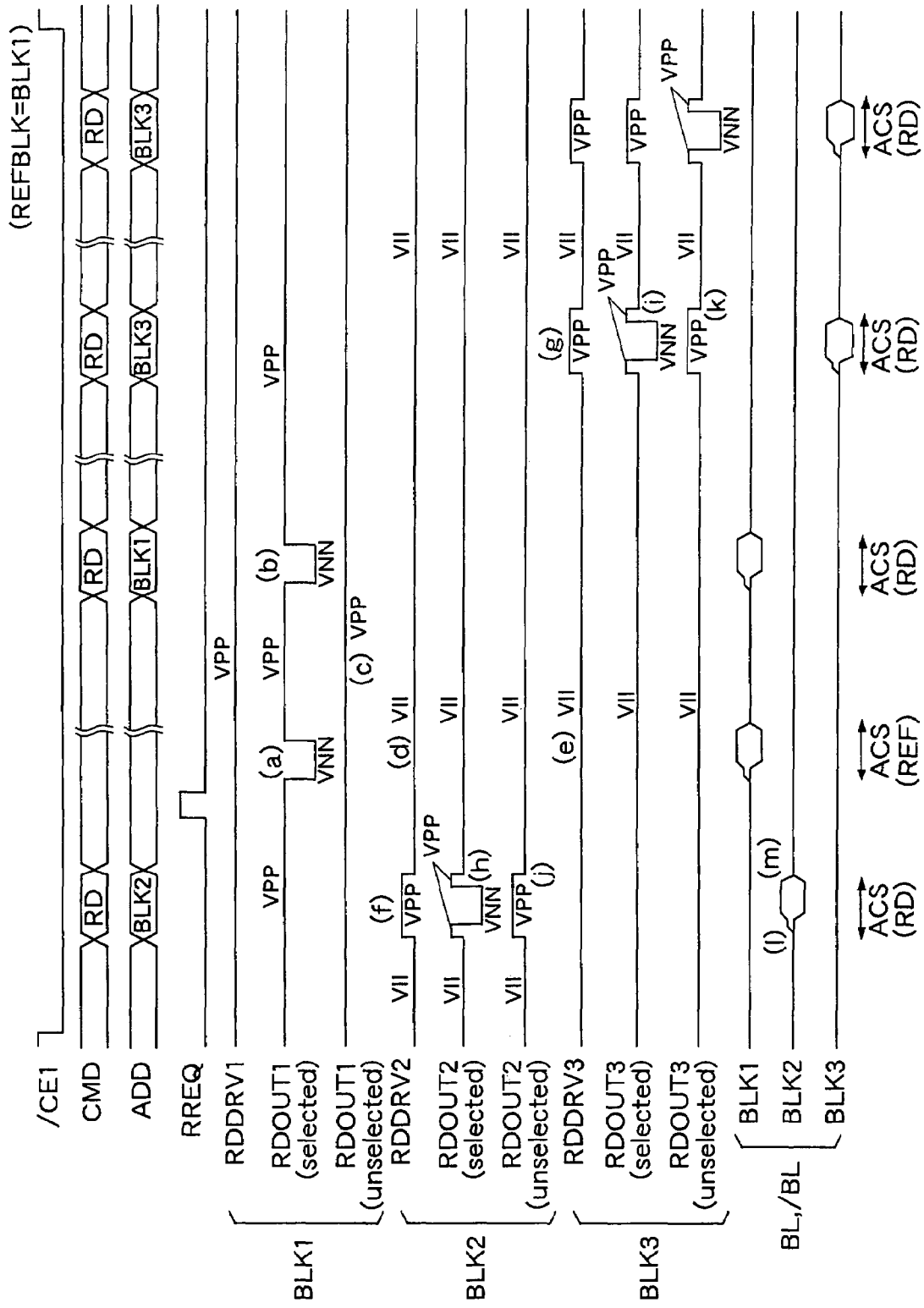
FIG. 14 is a timing chart showing an example of the operation in the first embodiment.

FIG. 14 shows an example of the operation in the first embodiment. In this example, the read command RD is supplied sequentially and the read operation of the memory blocks BLK2, BLK1, BLK3, and BLK3 is performed sequentially. At this time, the refresh block REFBLK in which the refresh operation is performed is the memory block BLK1. Because of this, the refresh operation REF in response to the refresh request signal RREQ that occurs after the first read command RD is performed in the memory block BLK1. The suffix numbers of the row driving signal RDDRV and the word control signal RDOUT correspond to the numbers of the memory blocks BLK0-3.

A row driving signal line RDDRV1 corresponding to the memory block BLK1, which is the refresh block REFBLK, is set to the boost voltage VPP. Because of this, in the read operation RD and the refresh operation REF of the memory block BLK1, a word control signal RDOUT1 output from the selected word decoder WDEC changes from the boost voltage VPP to the negative voltage VNN (FIG. 14(a, b)). The word control signal RDOUT1 output from the unselected word decoder WDEC is held at the boost voltage VPP (FIG. 14(c)).

In the memory blocks BLK0, 2, 3 other than the refresh block REFBLK, the row driving signal line RDDRV (RDDRV2, 3, etc.) is set to the internal power supply voltage VII during the non-access period (FIG. 14 (d, e)) and is set to the boost voltage VPP during the access period ACS (FIG. 14 (f, g)). In addition, during the access period ACS, the word control signal RDOUT (RDOUT2, 3, etc.) output from the selected word decoder WDEC changes sequentially to the voltages VII, VPP, VNN, VPP, and VII (FIG. 14 (h, i)). The word control signal RDOUT (RDOUT2, 3, etc.) output from the unselected word decoder WDEC changes sequentially to the voltages VII, VPP, and VII (FIG. 14 (j, k)).

When the read operation RD is performed, data is read from the memory cell MC to the bit line BL (or /BL) by the activation of the word line WL shown in FIG. 7 (FIG. 14 (l)). After this, the sense amplifier operates and the voltage difference between the bit lines BL, /BL is amplified, and data is output from the data terminal DQ (FIG. 14 (m)). The refresh operation REF is the same as the read operation RD except in that data is not output from the data terminal DQ. By the way, when the write command WR is supplied instead of the read command RD, write data is input to the bit lines BL, /BL via the data terminal DQ and written to the memory cell MC. The write operation WR is the same as the read operation RD except for the input/output operation of the data signal DQ.

Figure 15:
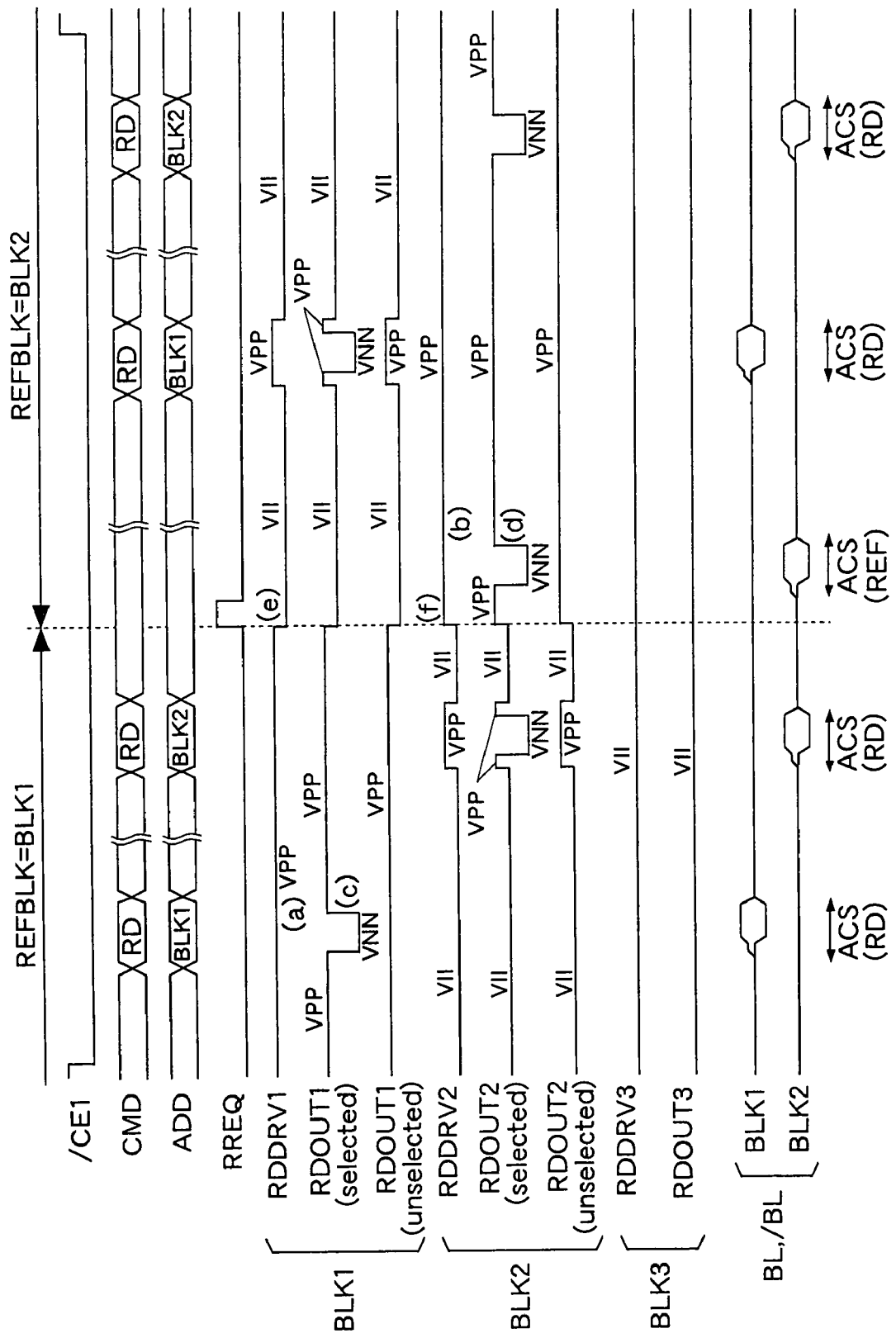
FIG. 15 is a timing chart showing another example of the operation in the first embodiment.

FIG. 15 shows another example of the operation in the first embodiment. The detailed description of the same operation as that in FIG. 14 is omitted. In this example, the read command RD is supplied sequentially and the read operation of the memory blocks BLK1, BLK2, BLK1, and BLK2 is performed sequentially. The refresh block REFBLK switches from the memory block BLK1 to the memory block BLK2 in response to the refresh request signal RREQ that occurs after the second read command RD.

In the refresh block REFBLK, the row driving signal line RDDRV (RDDRV1 or RDDRV2) is set to the boost voltage VPP (FIG. 15 (a, b)). As in FIG. 14, by the read operation RD and the refresh operation REF of the refresh block REFBLK, the word control signal RDOUT (RDOUT1 or RDOUT2) output from the selected word decoder WDEC changes from the boost voltage VPP to the negative voltage VNN (FIG. 15 (c, d)).

When the refresh block REFBLK changes from the memory block BLK1 to the memory block BLK2, in the gate control circuit 30 corresponding to the memory block BLK1, a refresh block signal REFBLKZ, not shown, changes from the high level to the low level. Due to this, the row driving signal line RDDRV1 changes from the boost voltage VPP to the internal power supply voltage VII (FIG. 15 (e)). In the gate control circuit 30 corresponding to the memory block BLK2, the refresh block signal REFBLKZ, not shown, changes from the low level to the high level. Due to this, the row driving signal line RDDRV2 changes from the internal power supply voltage VII to the boost voltage VPP (FIG. 15 (f)).

In this example, the refresh block REFBLK is switched to another in synchronization with the refresh request signal RREQ. However, the refresh block REFBLK may be switched to another in synchronization with the completion of the refresh operation REF. In this case, the refresh operation REF in response to the refresh request signal RREQ that switches the refresh block REFBLK to another is performed in the memory block BLK1. In addition, as in FIG. 14, the write command WR may be supplied instead of the read command RD.

Figure 16:
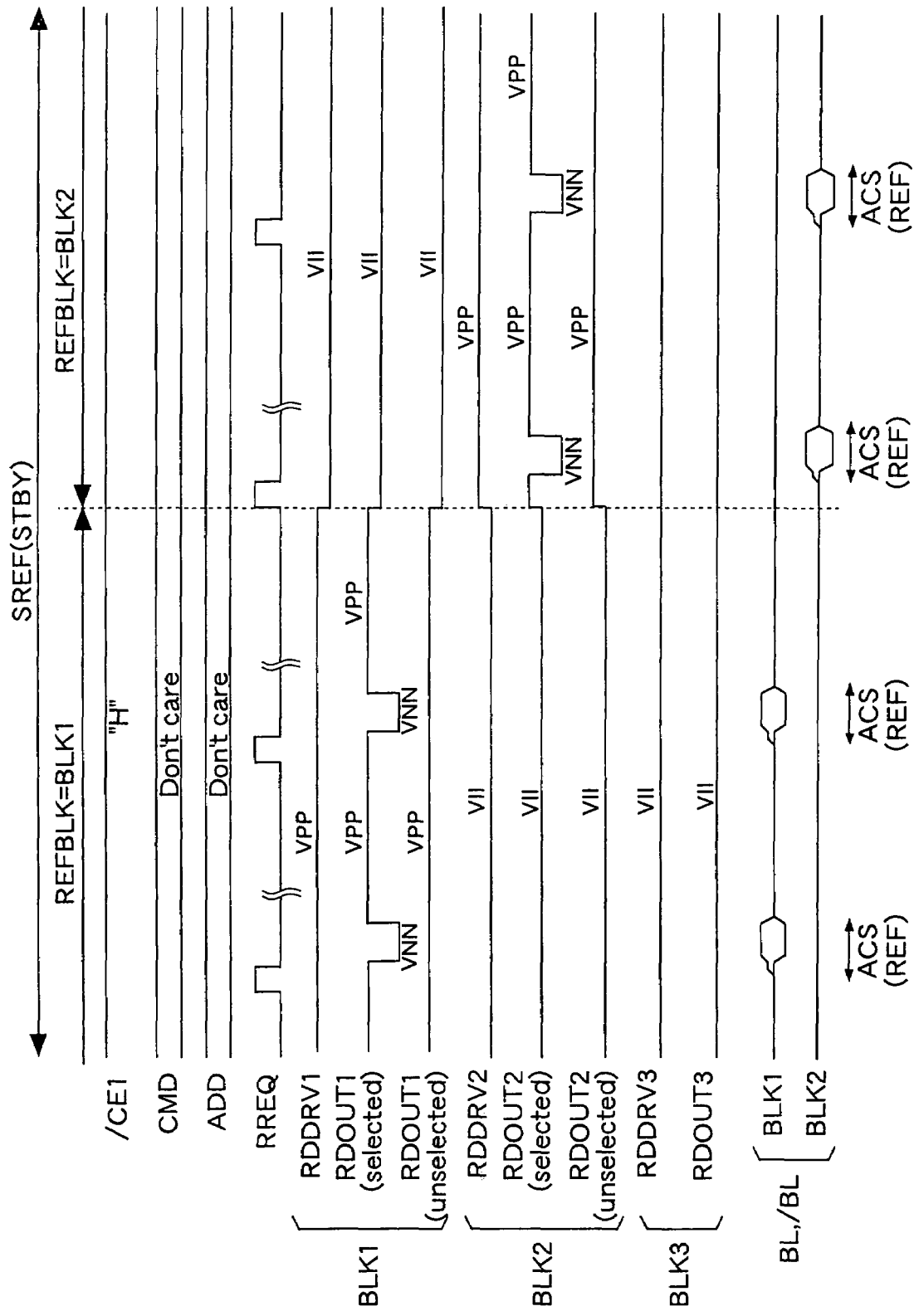
FIG. 16 is a timing chart showing the operation during the self-refresh period in the first embodiment.

FIG. 16 shows the operation during the self-refresh period SREF in the first embodiment. The detailed description of the same operation as that in FIG. 14 and FIG. 15 is omitted. The self-refresh period SREF is a period during which the chip enable signal /CE1 is inactivated to the high level H and the acceptance of the access command (read command RD and write command WR) is prohibited.

During the self-refresh period SREF, only the refresh operation REF that responds to the refresh request signal RREQ is performed. The switching operation of the voltage of the row driving signal line RDDRV (RDDRV1 or RDDRV2) is the same as that in FIG. 15. The refresh operation REF is the same as that in FIG. 9, FIG. 14, and FIG. 15.

As described above, in the first embodiment, the voltage control circuit VCNT is formed corresponding to the memory blocks BLK0-3 respectively, and the voltage to be applied to the gate of the PMOS transistor 34c of the word driver WDRV is set for each of the memory blocks BLK0-3 in accordance with the access state of each of the memory blocks BLK0-3. In other words, in the unselected blocks other than the refresh block REFBLK, the gate of the pMOS transistor 34c always receives the internal power supply voltage VII. Because of this, it is possible to prevent the GIDL current from flowing through the pMOS transistor 34c of the unselected block. Further, in the unselected block, since the voltage of the high level voltage line RDDRV does not change, it is possible to prevent charges from being charged/discharged to/from the high level voltage line RDDRV. In this manner, since the GIDL current is reduced and the charge/discharge current of the high level voltage line RDDRV is reduced, it is possible to reduce the current consumption of the pseudo SRAM.

In addition, in the refresh block REFBLK, the row driving signal line RDDRV is fixed to the boost voltage VPP. Because of this, it is possible to prevent the row driving signal line RDDRV from being charged/discharged for each refresh operation REF. As a result, in particular, it is possible to reduce the current consumption (standby current) of the pseudo SRAM during the self-refresh period SREF.

Figure 17:
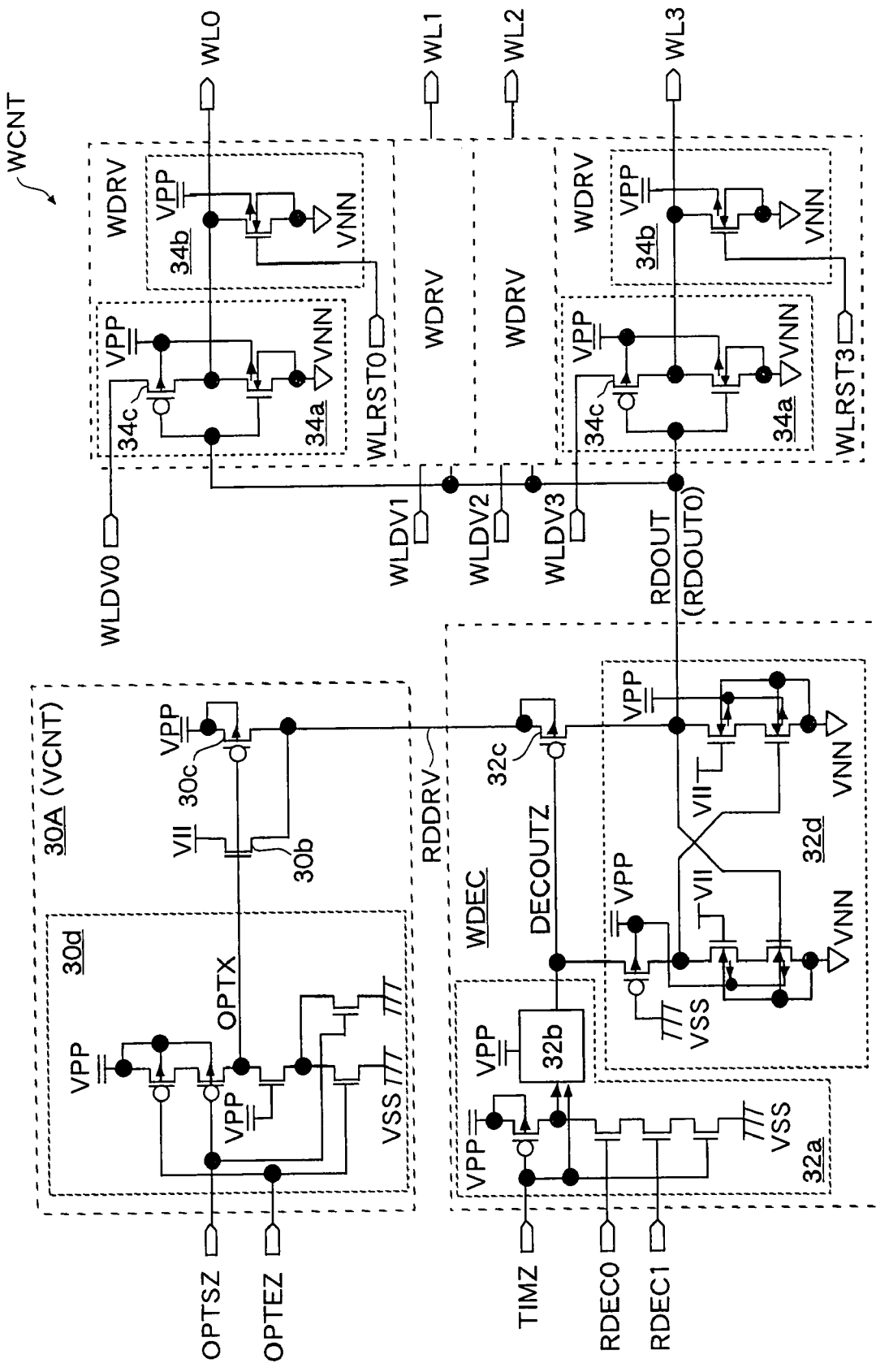
FIG. 17 is a circuit diagram showing the details of a word control circuit in a second embodiment of the present invention.

FIG. 17 shows the details of a word control circuit WCNT in a second embodiment. The same components as those described in the first embodiment will be assigned the same symbols and their detailed description will be omitted. The semiconductor memory in the present embodiment is formed as a pseudo SRAM using the CMOS process on a silicon substrate. In the present embodiment, a gate control circuit 30A is formed instead of the gate control circuit 30 in the first embodiment. Other configurations are the same as those in the first embodiment.

The gate control circuit 30A has a NOR circuit 30d, the nMOS transistor 30b, and the pMOS transistor 30c. The NOR circuit 30d outputs the operation signal OPTX at the low level (VSS) when any one of the operation start signal OPTSZ and the operation end signal OPTEZ is at the high level (VII). In the present embodiment, the NOR circuit 30d does not include the logic of the refresh block signal REFBLKZ. Because of this, the row driving signal line RDDRV is set to the boost voltage VPP only during the access period during which the read operation RD, the write operation WD, and the refresh operation REF are performed. During the non-access period other than the access period, the row driving signal line RDDRV is set to the internal power supply voltage VII. In other words, the voltage control circuit VCNT (the gate control circuit 30A) in the present embodiment performs only the first operation in the first embodiment.

Figure 18:
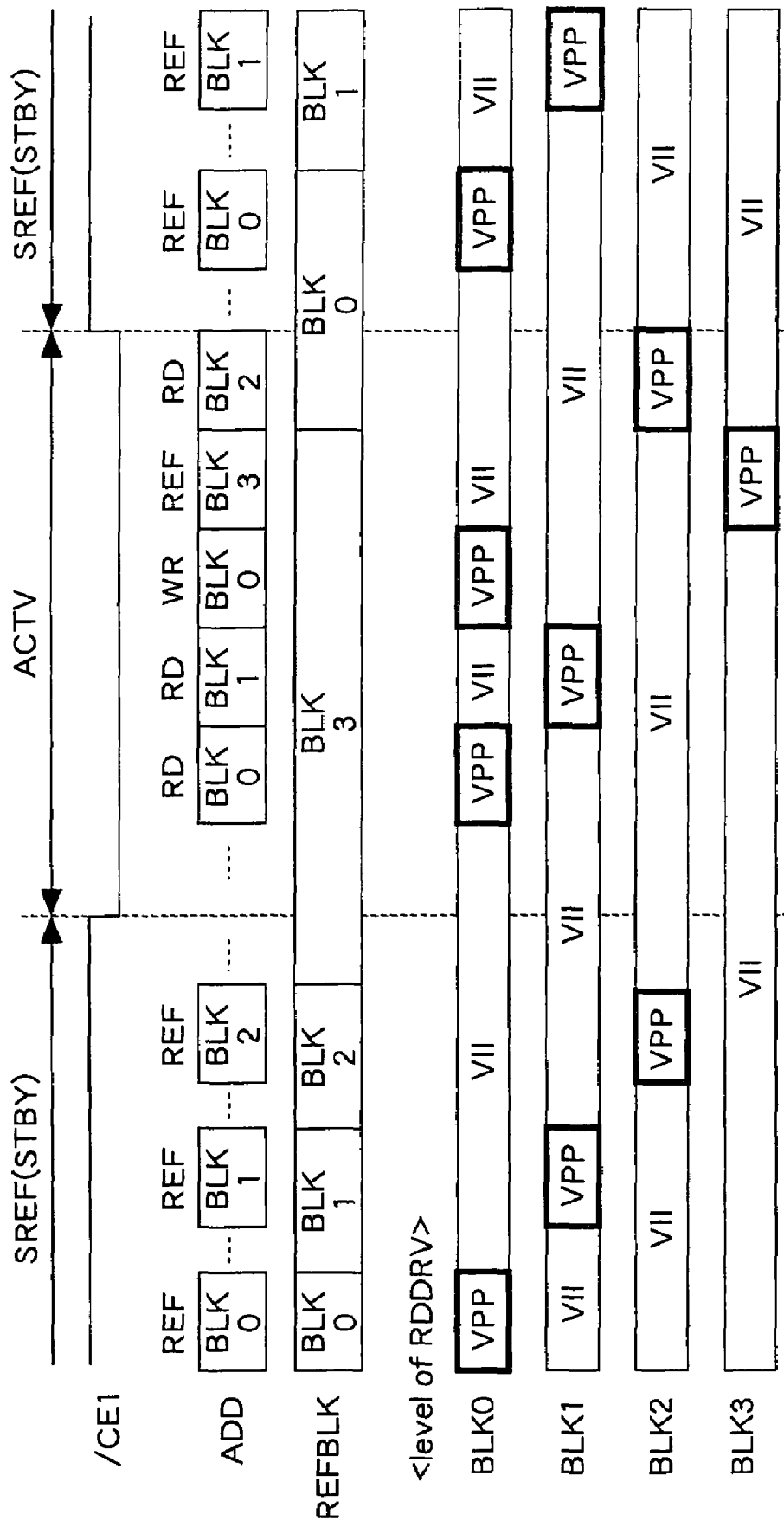
FIG. 18 is an explanatory diagram showing the outline of the operation in the second embodiment.

FIG. 18 shows the outline of the operation in the second embodiment. In this example, the supply timing of the chip enable signal /CE1, the supply timing of the access requests RD, WD, the generation timing of the refresh request signal REF, and the transition of the refresh block REFBLK are the same as those in the first embodiment (FIG. 10).

In the present embodiment, during the self-refresh period SREF, the row driving signal line RDDRV of each of the memory blocks BLK0-3 is set to the boost voltage VPP only while the refresh operation REF is performed. Because of this, in the refresh block REFBLK, the row driving signal line RDDRV is set to the internal power supply voltage V1 while the refresh operation REF is not performed.

As described above, it is possible to obtain the same effect as that in the above-described first embodiment also in the second embodiment. Further, when the GIDL current that flows through the pMOS transistor 34c of the word driver WDRV is relatively large, it is possible to minimize the standby current, which is the current consumption during the self-refresh period SREF, by shortening the period during which the boost voltage VPP is applied to the gate of the transistor 34c.

Figure 19:
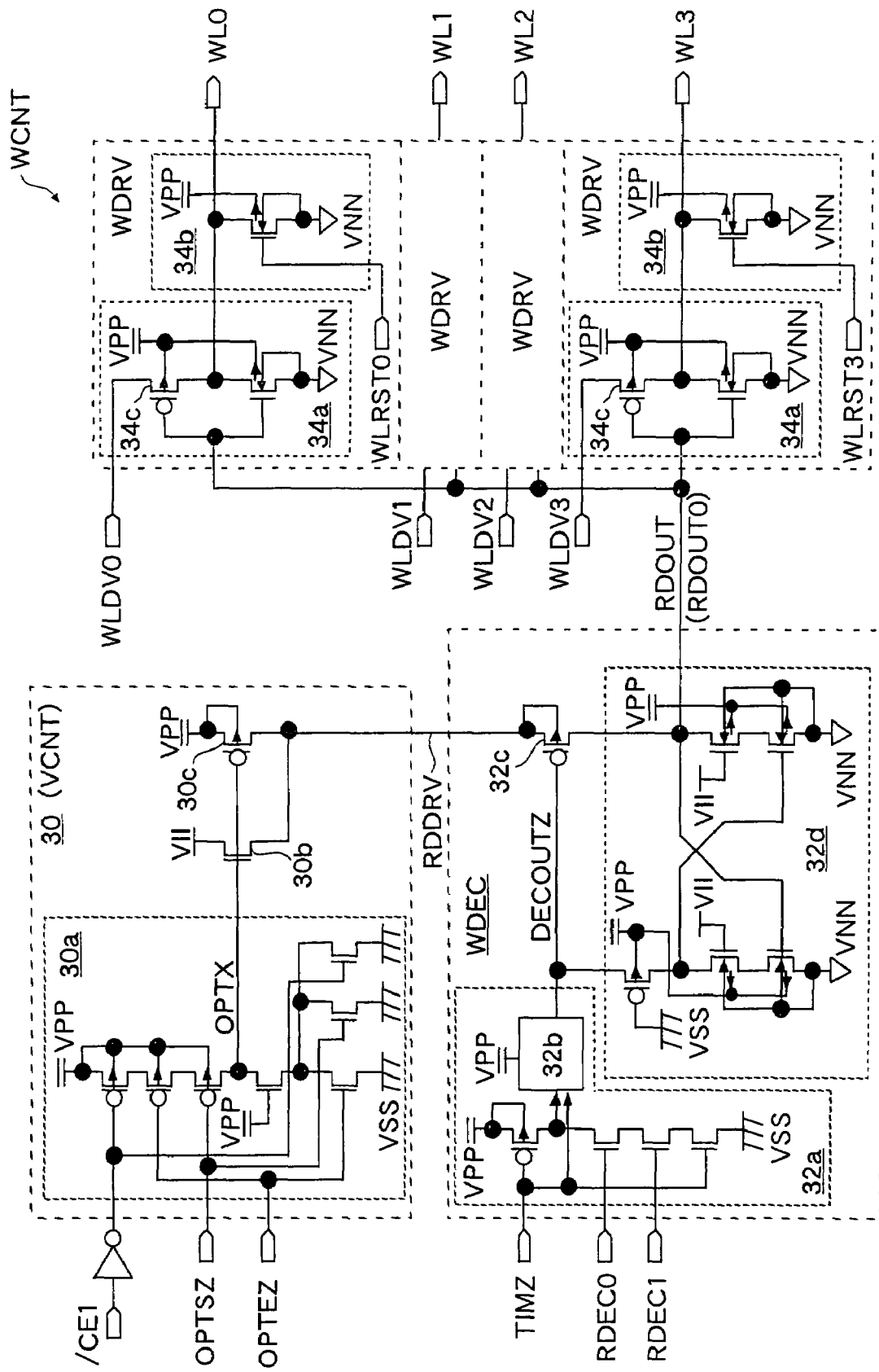
FIG. 19 is a circuit diagram showing the details of a word control circuit in a third embodiment of the present invention.

FIG. 19 shows the details of a word control circuit WCNT in a third embodiment of the present invention. The same components as those described in the first and second embodiments will be assigned the same symbols and their detailed description will be omitted. The semiconductor memory in the present embodiment is formed as a pseudo SRAM using the CMOS process on a silicon substrate. In the present embodiment, the NOR gate 30a of the gate control circuit 30 receives a signal with a reversed logic level of the chip enable signal /CE1, not the refresh block signal REFBLKZ. Because of this, the row driving signal line RDDRV is set to the boost voltage VPP only during the activation period ACTV during which the chip enable signal /CE1 is activated and during the access period during which the refresh operation is performed. During the self-refresh period SREF, the row driving signal line RDDRV is set to the internal power supply voltage VII during the non-access period other than the access period. Other configurations are the same as those in the first embodiment.

Figure 20:
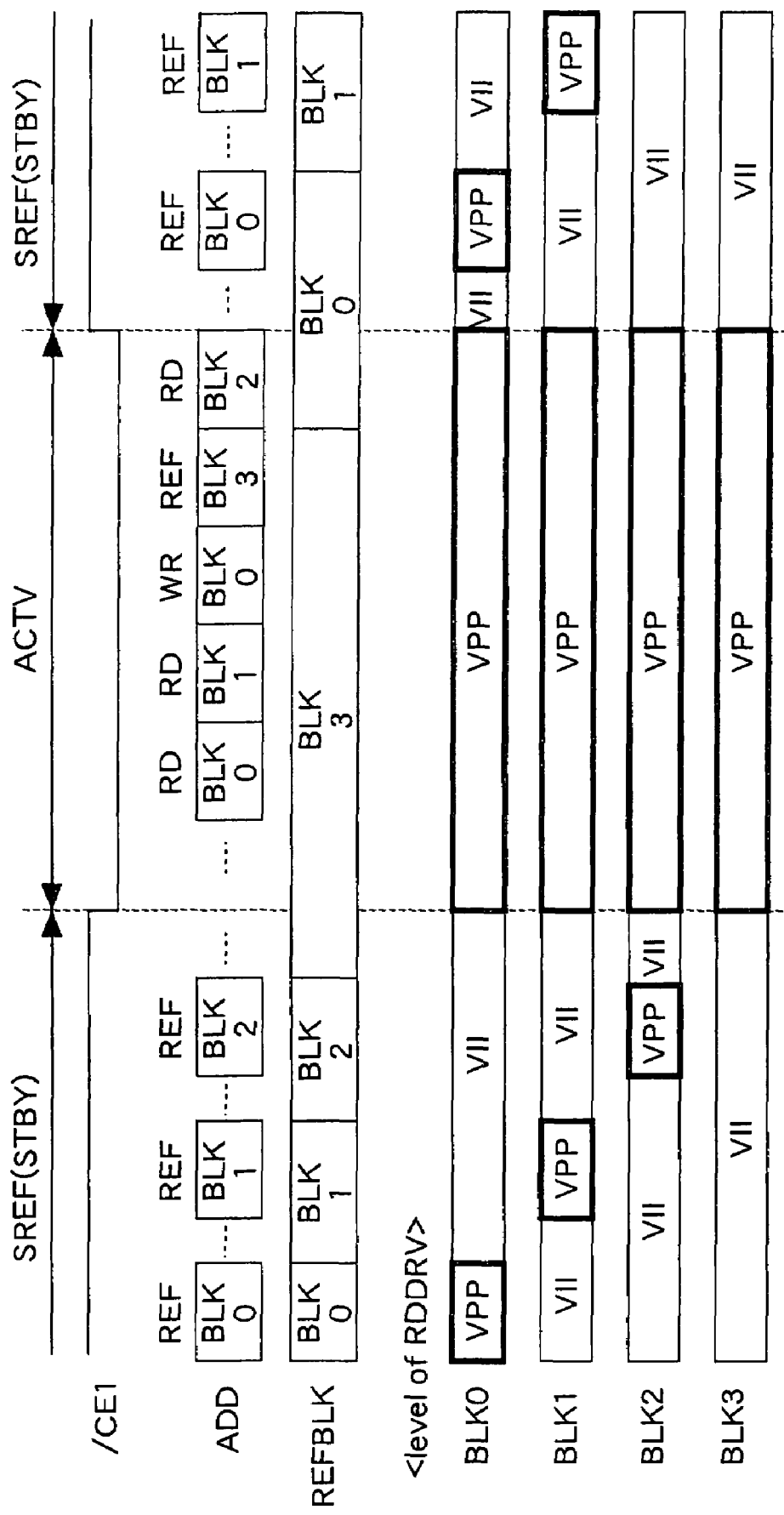
FIG. 20 is an explanatory diagram showing the outline of the operation in the third embodiment.

FIG. 20 shows the outline of the operation in the third embodiment. In this example, the supply timing of the chip enable signal /CE1, the supply timing of the access requests RD and WR, the generation timing of the refresh request signal REF, and the transition of the refresh block REFBLK are the same as those in FIG. 10 and FIG. 18 described above. In addition, the levels of the row driving signal lines RDDRV are the same as those in the second embodiment (FIG. 18) except in that the levels are set to the boost voltage VPP in all of the memory blocks BLK0-3 during the active period ACTV.

In other words, the gate control circuit 30 of the voltage control circuit VCNT performs the first operation for connecting the row driving signal line RDDRV to the boost voltage line VPP during the access period of the corresponding memory block BLK and connecting it to the internal power supply voltage line VII during the non-access period of the corresponding memory block BLK during the self-refresh period SREF. In addition, the gate control circuit 30 of the voltage control circuit VCNT performs a third operation for connecting the row driving signal line RDDRV to the boost power supply line VPP during the activation period ACTV.

As described above, it is possible to obtain the same effect as that in the first and second embodiments described above also in the third embodiment. Further, it is possible to reduce the current consumption during the activation period ACTV by preventing the switching of the voltage of the row driving signal line RDDRV during the activation period ACTV.

In addition, during the activation period ACTV, many circuits operate due to the access operations RD, WR, and REF, and therefore, the current consumption is large and noises tend to occur. It is possible to reduce the peak current by preventing the charge/discharge current from occurring in the row driving signal line RDDRV during the activation period ACTV. As a result, the occurrence of noises can be suppressed. In addition, since the peak current can be reduced, the wiring width of the power supply line can be reduced and the chip can be reduced in size.

Figure 21:
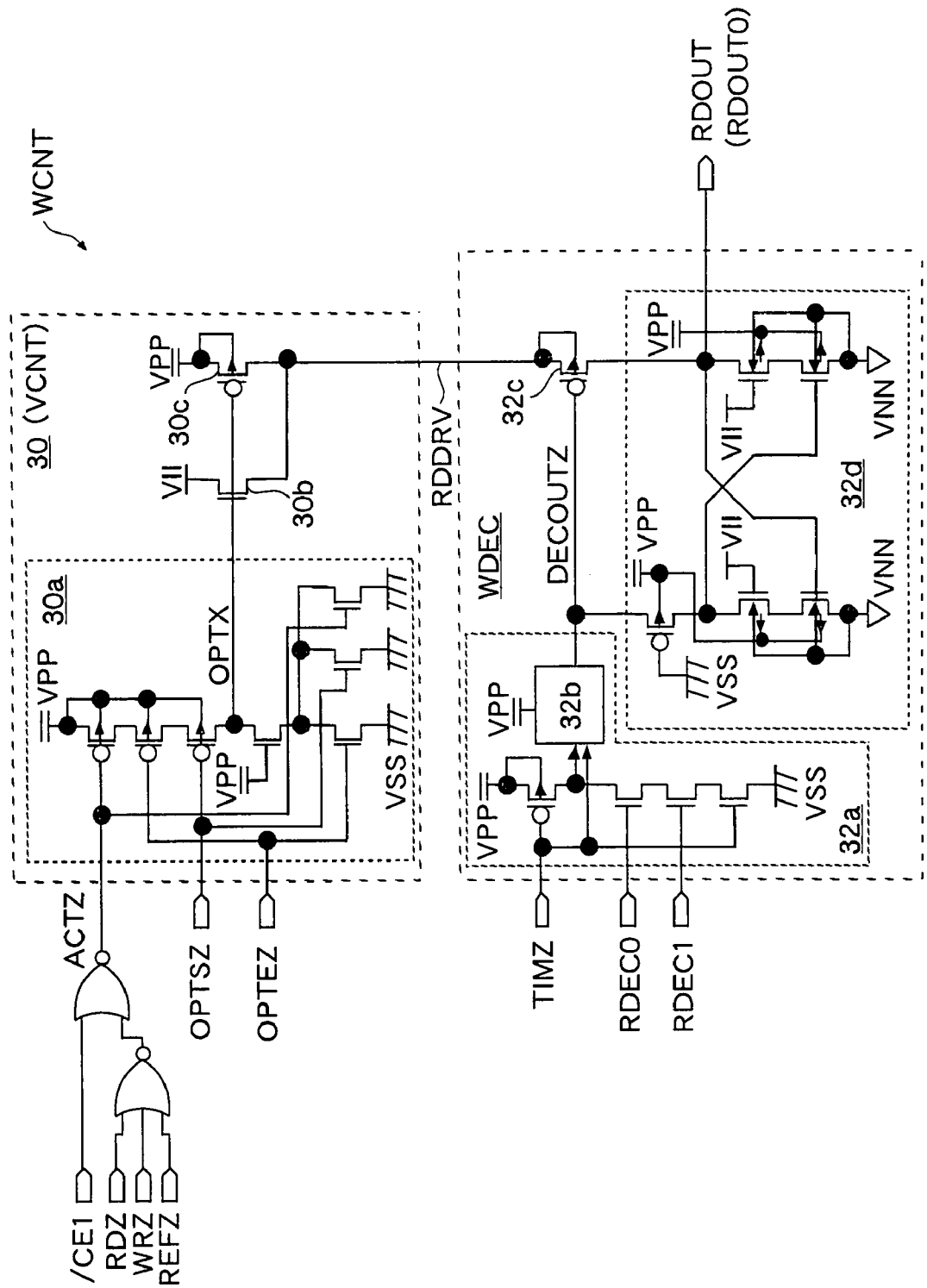
FIG. 21 is a circuit diagram showing the details of a word control circuit in a fourth embodiment of the present invention.

FIG. 21 shows the details of a word control circuit WCNT in a fourth embodiment. The same components as those described in the first and second embodiments will be assigned the same symbols and their detailed description will be omitted. The semiconductor memory in the present embodiment is formed as a pseudo SRAM using the CMOS process on a silicon substrate. In the present embodiment, the NOR gate 30a of the gate control circuit 30 receives an active signal ACTZ, not the refresh block signal REFBLKZ. Other configurations are the same as those in the first embodiment.

A read signal RDZ is activated while the read operation is performed in response to the read command RD. A write signal WRZ is activated while the write operation is performed in response to the write command WR. A refresh signal REFZ is activated while the refresh operation is performed as show in FIG. 1. Consequently, the active signal ACTZ is activated to the high level during the activation period ACTV during which the chip enable signal /CE1 is activated when the read operation RD, the write operation WR, or the refresh operation REF is performed in any one of the memory blocks BLK0-3. Because of this, the row driving signal lines RDDRV are set to the boost voltage VP in all of the memory blocks BLK0-3 during the activation period ACTV when the read operation RD, the write operation WR, or the refresh operation REF is performed.

Figure 22:
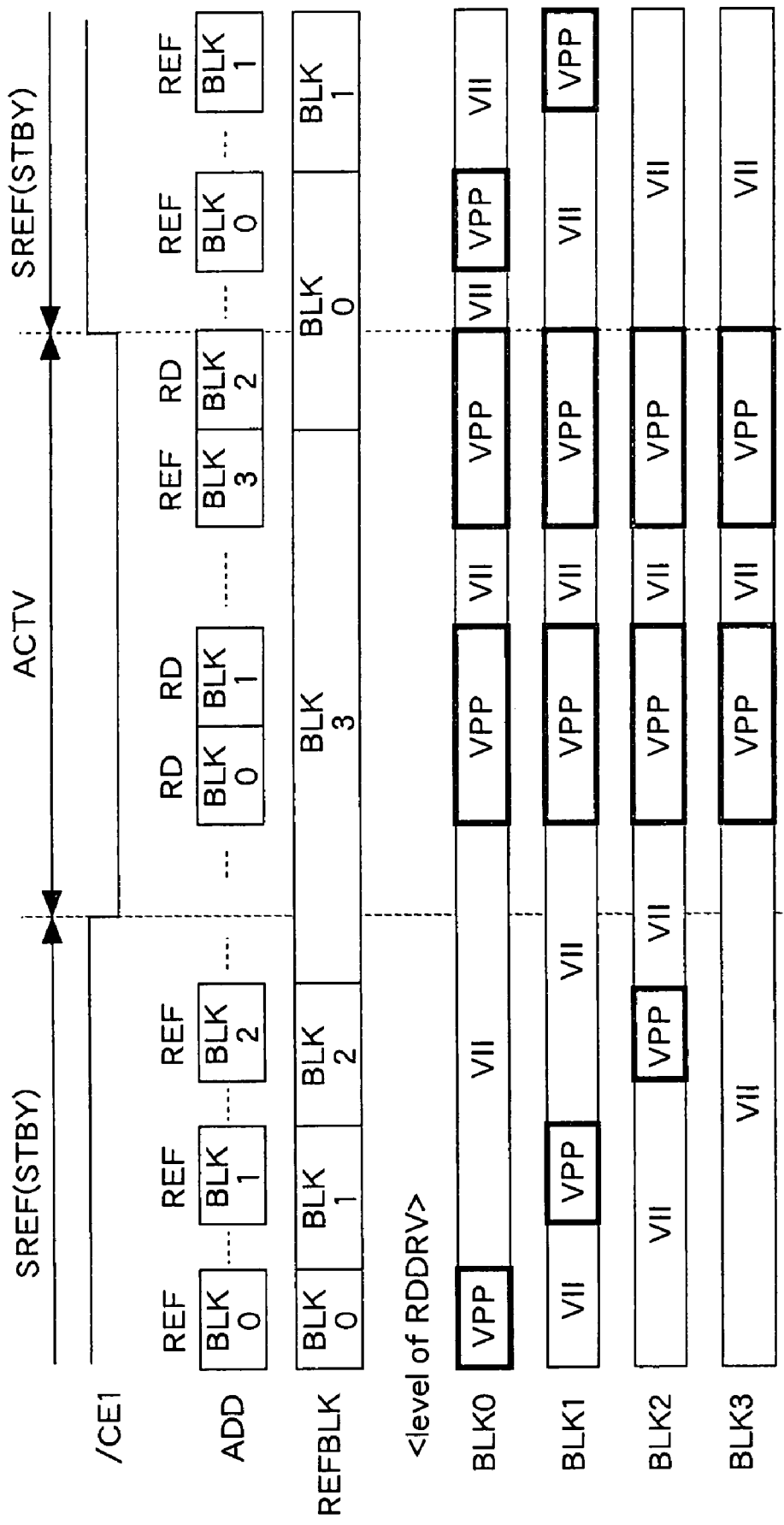
FIG. 22 is an explanatory diagram showing the outline of the operation in the fourth embodiment.

FIG. 22 shows the outline of the operation in the fourth embodiment. In this example, the supply timing of the chip enable signal /CE1, the supply timing of the access requests RD and WR, the generation timing of the refresh request signal REF, and the transition of the refresh block REFBLK are the same as those in FIG. 10 and FIG. 18 described above. In addition, the levels of the row driving signal lines RDDRV are the same as those in the second embodiment (FIG. 18) except in that the levels are set to the boost voltage VPP in all of the memory blocks BLK0-3 during access operation (RD, WR, or REF) during the activation period ACTV.

In other words, the gate control circuit 30 of the voltage control circuit VCNT performs the first operation for connecting the row driving signal line RDDRV to the boost voltage line VPP during the access period of the corresponding memory block BLK and connecting it to the internal power supply voltage line VII during the non-access period of the corresponding memory block BLK during the self-refresh period SREF. In addition, the gate control circuit 30 of the voltage control circuit VCNT performs a fourth operation for connecting the row driving signal lines RDDRV in all of the memory blocks BLK0-3 to the boost power supply line VPP when any one of the memory blocks BLK0-3 is accessed during the activation period ACTV and connecting them to the internal power supply voltage line VII when none of the memory blocks BLK0-3 is accessed.

As described above, it is possible to obtain the same effect as that in the first and second embodiments described above also in the fourth embodiment. In particular, in a system in which the frequency of supply of the read command RD and the write command WR is relatively small during the activation period ACTV, it is possible to reduce the period of time during which the boost voltage VPP is supplied to the gate of the pMOS transistor 34c (FIG. 5) of the word driver WDRV. As a result, the GIDL current can be reduced.

Figure 23:
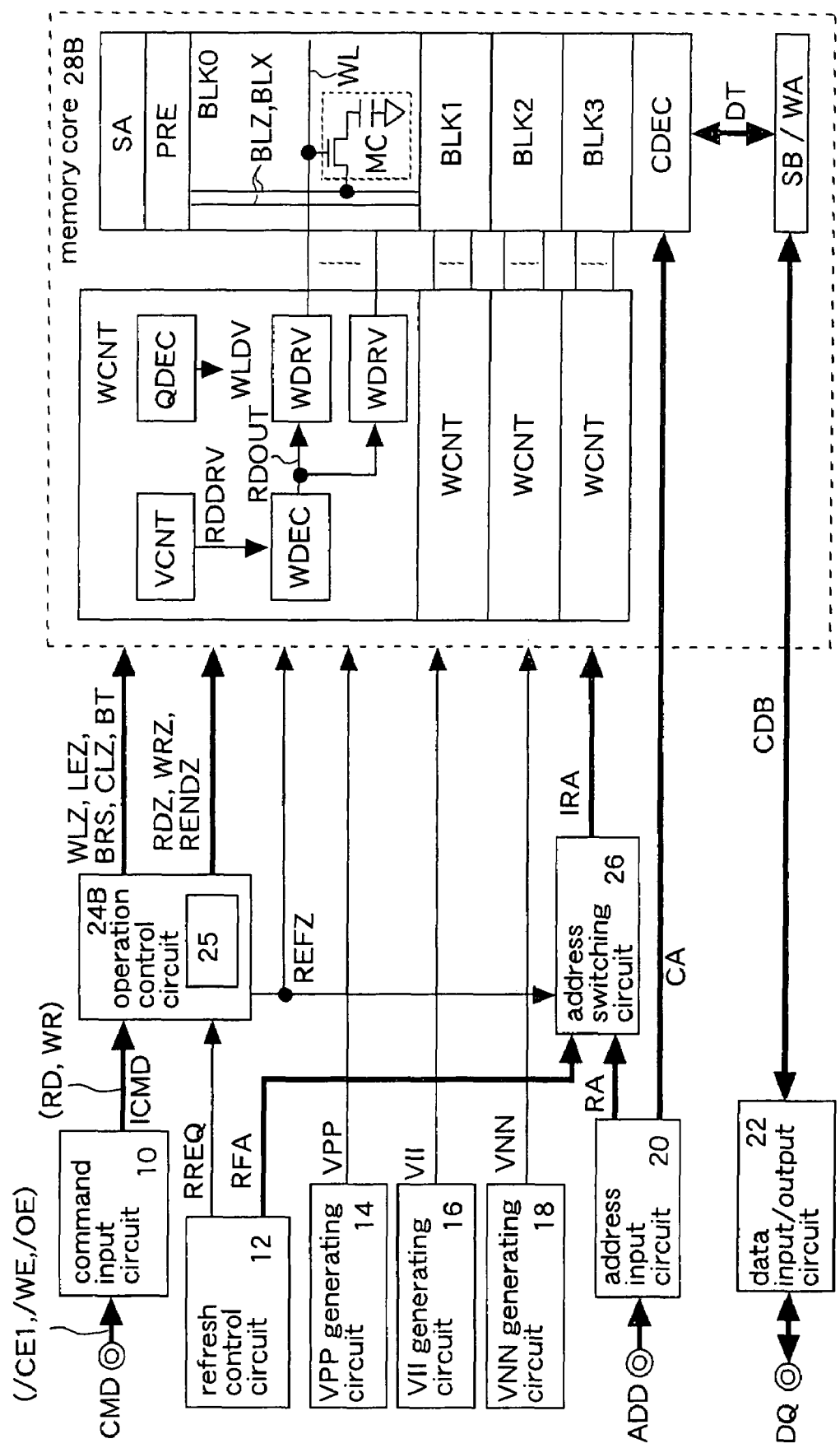
FIG. 23 is a block diagram showing a fifth embodiment of the present invention.

FIG. 23 shows a fifth embodiment of the present invention. The same components as those described in the first embodiment will be assigned the same symbols and their detailed description will be omitted. The semiconductor memory in the present embodiment is formed as a pseudo SRAM using the CMOS process on a silicon substrate. In the present embodiment, instead of the operation control circuit 24 and the memory core 28 in the first embodiment, an operation control circuit 24B and a memory core 28B are formed. Other configurations are the same as those in the first embodiment. In the memory core 28B, the configuration of the voltage control circuit VCNT differs from that in the first embodiment.

In addition to the function of the operation control circuit 24 in the first embodiment, the operation control circuit 24B has a function of outputting the read signal RDZ, the write signal WRZ, and a refresh end signal RENDZ. The read signal RDZ is activated while the read operation is performed in response to the read command RD. The write signal WRZ is activated while the write operation is performed in response to the write command WR. The refresh end signal RENDZ is activated in response to the completion of the refresh operation.

Figure 24:
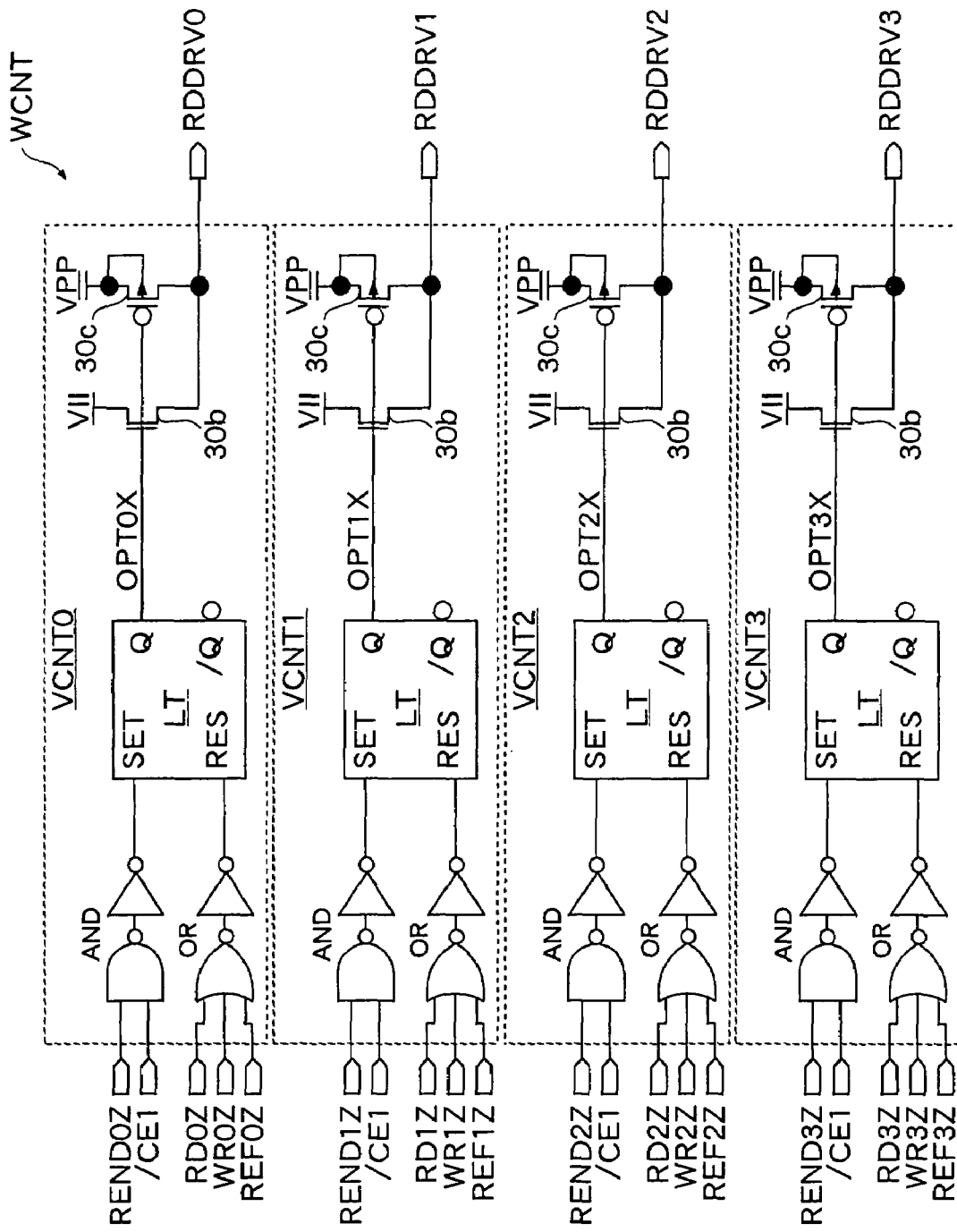
FIG. 24 is a circuit diagram showing the details of the word control circuit shown in FIG. 23.

FIG. 24 shows the details of the voltage control circuit VCNT (VCNT0-3). The voltage control circuits VCNT0-3 correspond to the memory blocks BLK0-3. Since the voltage control circuits VCNT0-3 are identical to one another, the voltage control circuit VCNT0 will be described. The numbers attached to the signal names in the figure correspond to the numbers of the memory blocks BLK0-3.

The voltage control circuit VCNT0 has a latch circuit LT, an AND circuit connected to a set terminal SET of the latch circuit LT, an OR circuit connected to a reset terminal RES of the latch circuit LT, and the nMOS transistor 30b and the pMOS transistor 30c to the gates of which an operation signal OPT0X output from an output terminal Q (positive logic) of the latch circuit LT is connected.

The AND circuit receives the refresh end signal REND0Z and the chip enable signal /CE1. The refresh end signal REND0Z is activated in synchronization with the activation of the refresh signal RENDZ when the refresh operation of the memory block BLK0 is completed. The OR circuit receives a read signal RD0Z, a write signal WR0Z, and a refresh signal REF0Z. The read signal RD0Z is activated during the activation of the read signal RDZ when the read operation of the memory block BLK0 is performed. The write signal WR0Z is activated during the activation of the write signal WRZ when the write operation of the memory block BLK0 is performed. The refresh signal REF0Z is activated during the activation of the refresh signal REFZ when the refresh operation of the memory block BLK0 is performed.

The latch circuit LT is set when receiving the activation of the refresh end signal REND0Z at the set terminal SET during the self-refresh period SREF and sets the operation signal OPT0X to a high logic level. At this time, the row driving signal line RDDRV is set to the internal power supply voltage VII. In addition, the latch circuit LT is reset when receiving the activation of the read signal RD0Z, the write signal WR0Z, or the refresh signal REF0Z at the reset terminal RES and sets the operation signal OPT0X to a low logic level. At this time, the row driving signal line RDDRV is set to the boost voltage VPP.

Figure 25:
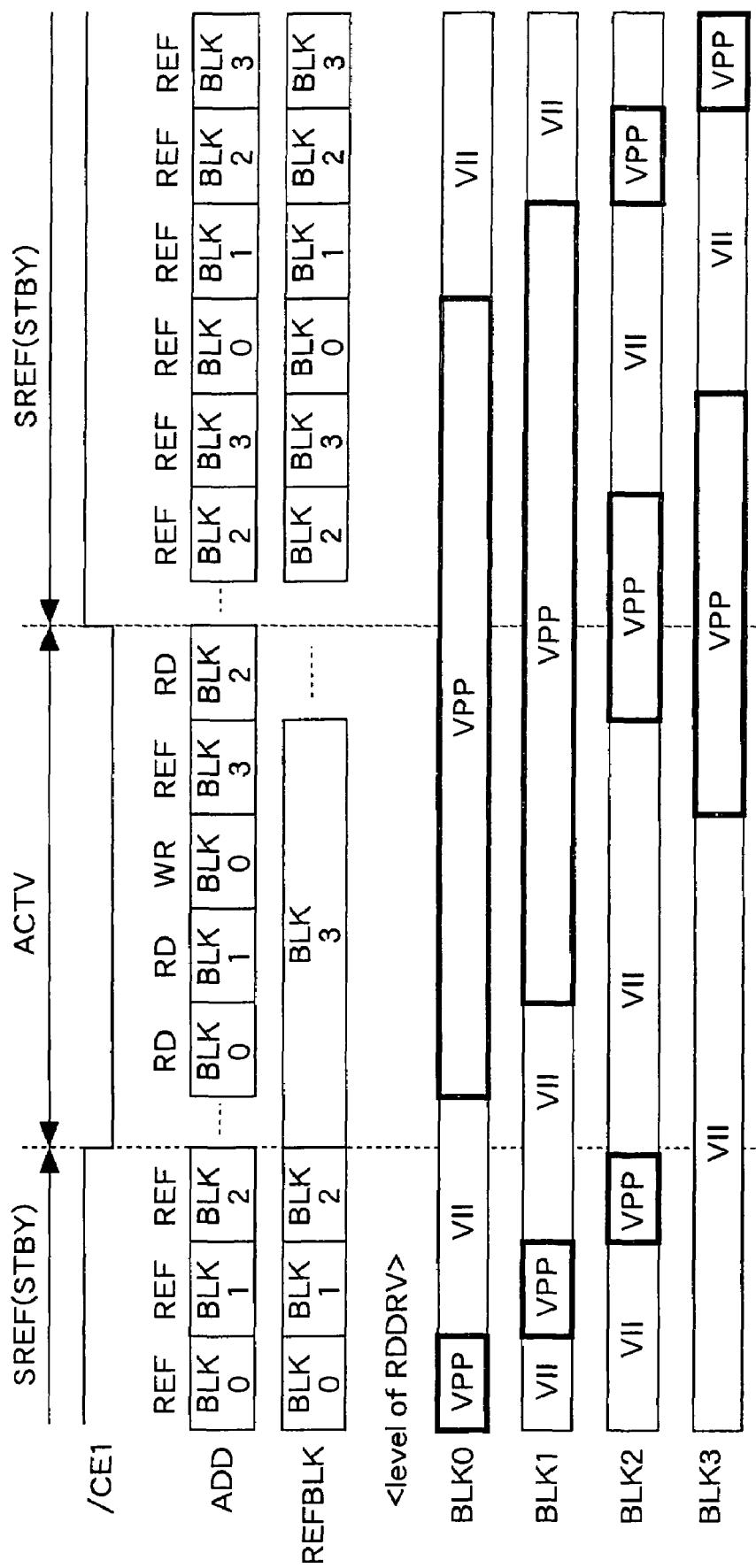
FIG. 25 is an explanatory diagram showing the outline of the operation in the fifth embodiment.

FIG. 25 shows the outline of an operation in the fifth embodiment. In this example, the supply timing of the chip enable signal /CE1, the supply timing of the access requests RD and WR, the generation timing of the refresh request signal REF, and the transition of the refresh block REFBLK are the same as those in FIG. 10 and FIG. 18 described above.

In the present embodiment, as described in FIG. 24, the level of the row driving signal line RDDRV is set to the boost voltage VPP in synchronization with the start of the read operation RD, the write operation WR, and the refresh operation REF (reset of the latch circuit LT). In addition, the level of the row driving signal line RDDRV is set to the internal power supply voltage VII in synchronization with the completion of the refresh operation REF (set of the latch circuit LT). In other words, the level of the row driving signal line RDDRV is set to the boost voltage VPP in response to the access requests RD, WR, and REF during the activation period ACTV and is set to the internal power supply voltage VII in response to the completion of the refresh operation REF in accordance with the refresh request signal REF during the self-refresh period SREF.

In the figure, during the activation period ACTV and the self-refresh period SREF following the activation period ACTV, the period during which the level of the row driving signal line RDDRV is set to the boost voltage VPP is the period during which a fifth operation is performed. During the self-refresh period SREF, the period during which the fifth operation is not performed is the period during which the first operation is performed.

As described above, it is possible to obtain the same effect as that in the first and second embodiments described above also in the fifth embodiment. Further, it is possible to reduce the frequency of switching of the voltage of the row driving signal line RDDRV and the charge/discharge current that occurs in the row driving signal line RDDRV can be reduced further.

Figure 26:
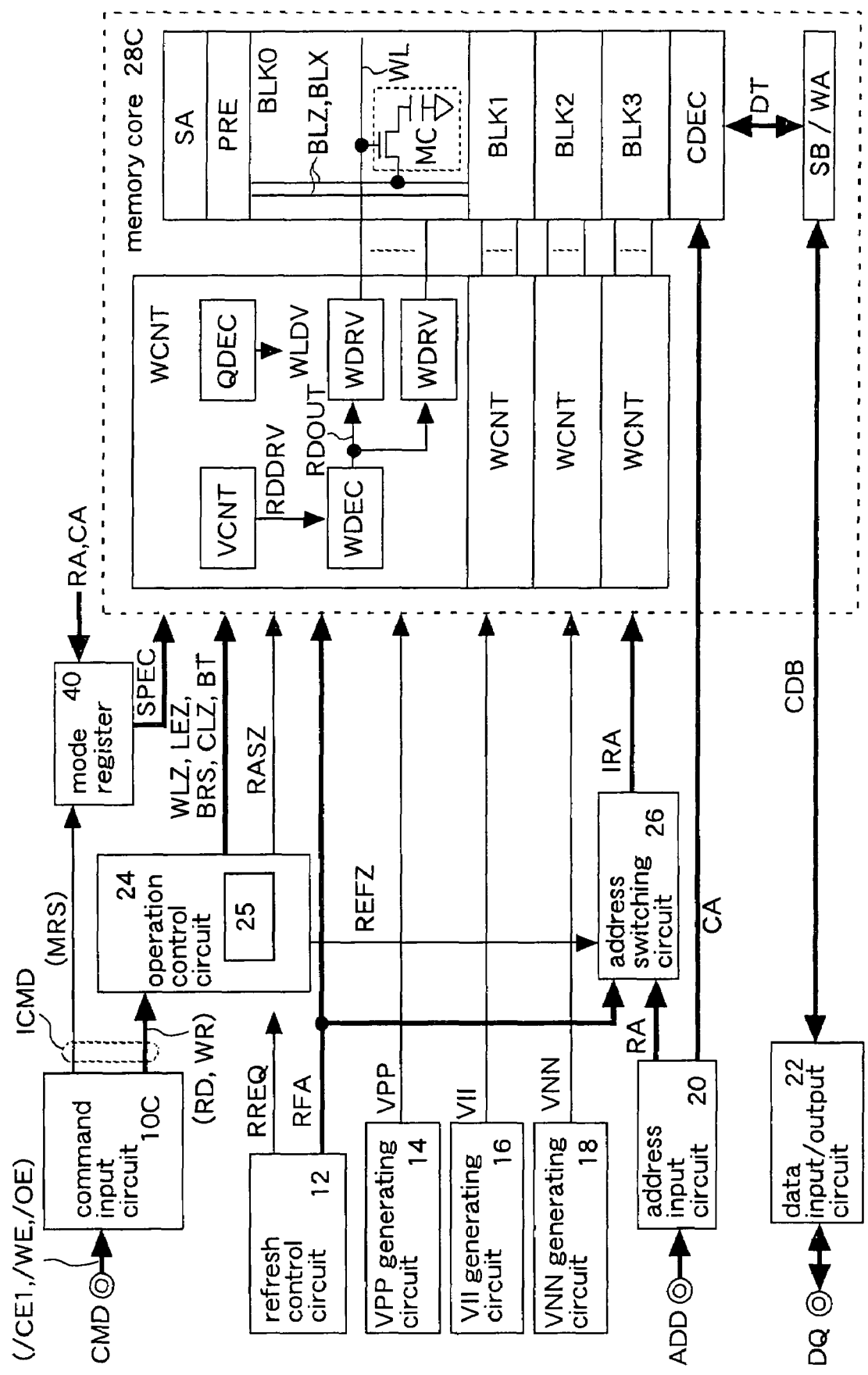
FIG. 26 is a block diagram showing a sixth embodiment of the present invention.

FIG. 26 shows a sixth embodiment of the present invention. The same components as those described in the first embodiment will be assigned the same symbols and their detailed description will be omitted. The semiconductor memory in the present embodiment is formed as a pseudo SRAM using the CMOS process on a silicon substrate. In the present embodiment, instead of the command input circuit 10 and the memory core 28 in the first embodiment, a command input circuit 10C and a memory core 28C are formed. In addition, a mode register 40 is newly formed. Other configurations are the same as those in the first embodiment. In the memory core 28C, the configuration of the voltage control circuit VCNT differs from that in the first embodiment.

In addition to the function of the command input circuit 10 in the first embodiment, the command input circuit 10C has a function of decoding the command signal CMD and recognizing a mode register set command MRS. The mode register set command MRS is a command to set the mode register 40. The mode register 40 is set, for example, in accordance with the address signals RA and CA supplied together with the mode register set command MRS. The mode resister 40 outputs a specification signal SPEC in accordance with the set value. In addition, the mode register 40 outputs another mode signal, not shown, in order to change the operating specification of a memory MEM. The mode register 40 is set by the CPU when, for example, the system SYS shown in FIG. 6 is powered on.

The voltage control circuit VCNT performs the same operation (the first and second operations) as that in the first embodiment when the specification signal SPEC indicates the first specification. The voltage control circuit VCNT prohibits the first and second operations when the specification signal SPEC indicates the second specification and maintains the connection of the row driving signal lines RDDRV of all of the memory blocks BLK0-3 to the boost voltage VPP. For example, when the specification signal SPEC indicates the second specification, the gate control circuit 30 (FIG. 4, FIG. 5) of the voltage control circuit VCNT activates the refresh block signal REFBLKZ in all of the memory blocks BLK0-3 irrespective of the refresh address signal RFA. Due to this, the operation of the second specification can be realized.

As described above, it is possible to obtain the same effect as that in the first embodiment described above also in the sixth embodiment. Further, it is possible to set the operating specification of the pseudo SRAM to the first specification in which the voltage of the row driving signal line RDDRV is switched to the voltages VPP and VII or the second specification in which the row driving signal line RDDRV is fixed to the voltage VPP in accordance with the set value of the mode register 40. In other words, it is possible to realize a plurality of kinds of pseudo SRAM by the single design data.

Figure 27:
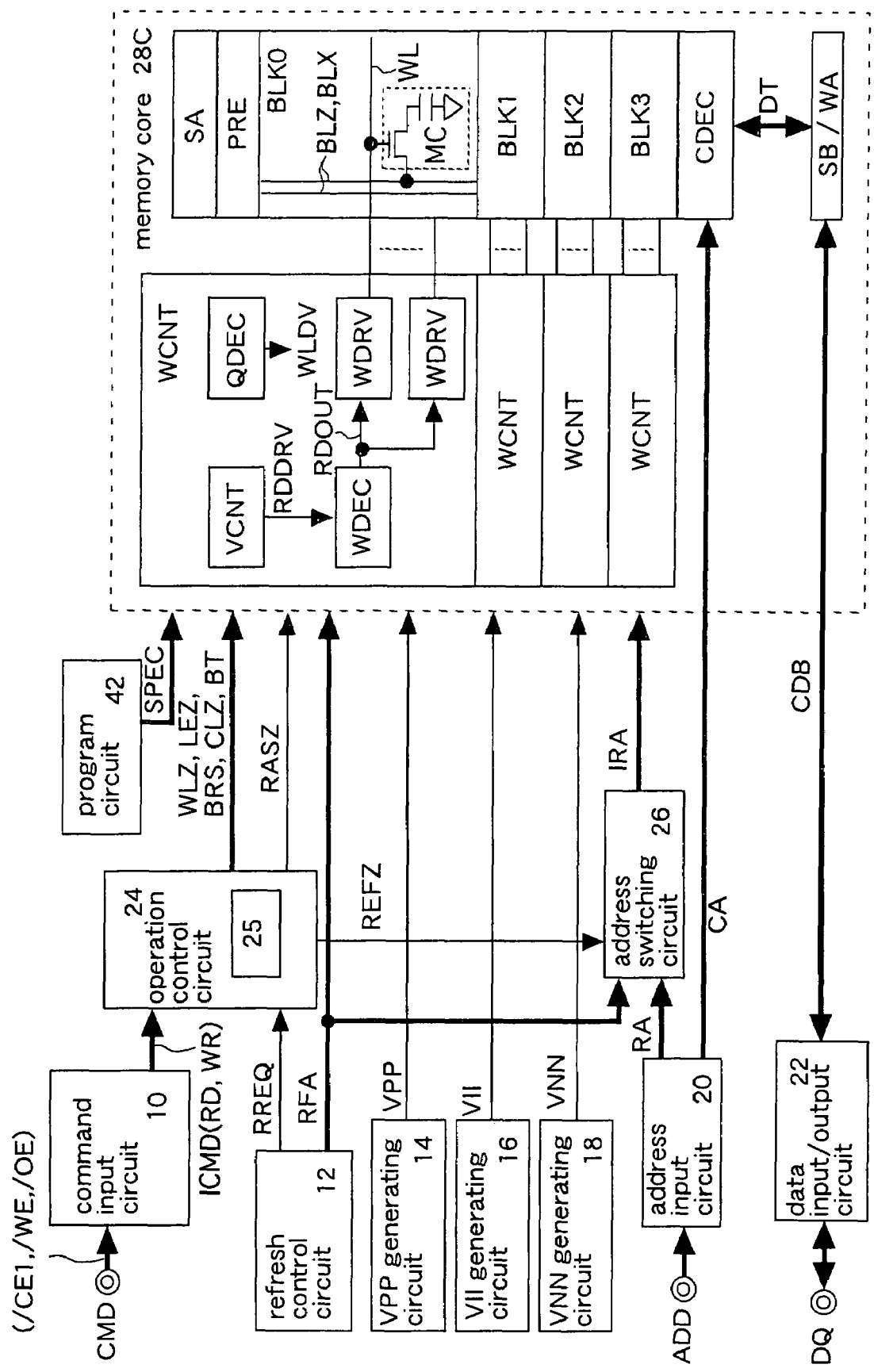
FIG. 27 is a block diagram showing a seventh embodiment of the present invention.

FIG. 27 shows a seventh embodiment of the present invention. The same components as those described in the first and sixth embodiments will be assigned the same symbols and their detailed description will be omitted. The semiconductor memory in the present embodiment is formed as a pseudo SRAM using the CMOS process on a silicon substrate. In the present embodiment, instead of the memory core 28 in the first embodiment, the memory core 28C in the sixth embodiment is formed. In addition, a program circuit 42 is newly formed. Other configurations are the same as those in the first embodiment. In the memory core 28C, the configuration of the voltage control circuit VCNT differs from that in the first embodiment.

The program circuit 42 can be programmed from, for example, the outside of the pseudo SRAM and has a fuse corresponding to the logic of the specification signal SPEC. The fuse functions as a programmable nonvolatile storage part. The program circuit 42 outputs the specification signal SPEC indicative of the first specification when the fuse is not programmed. The program circuit 42 outputs the specification signal SPEC indicative of the second specification when the fuse is programmed. For example, the fuse is one that can be programmed by irradiation of laser light. Alternatively, the fuse may be one that is programmed by an overvoltage or an overcurrent, or may be configured using an electrically programmable nonvolatile memory cell.

As described above, it is possible to obtain the same effect as that in the first and sixth embodiments described above also in the seventh embodiment. Further, it is possible to program the product specification of the pseudo SRAM in the manufacturing process of the pseudo SRAM by the program circuit 42.

Figure 28:
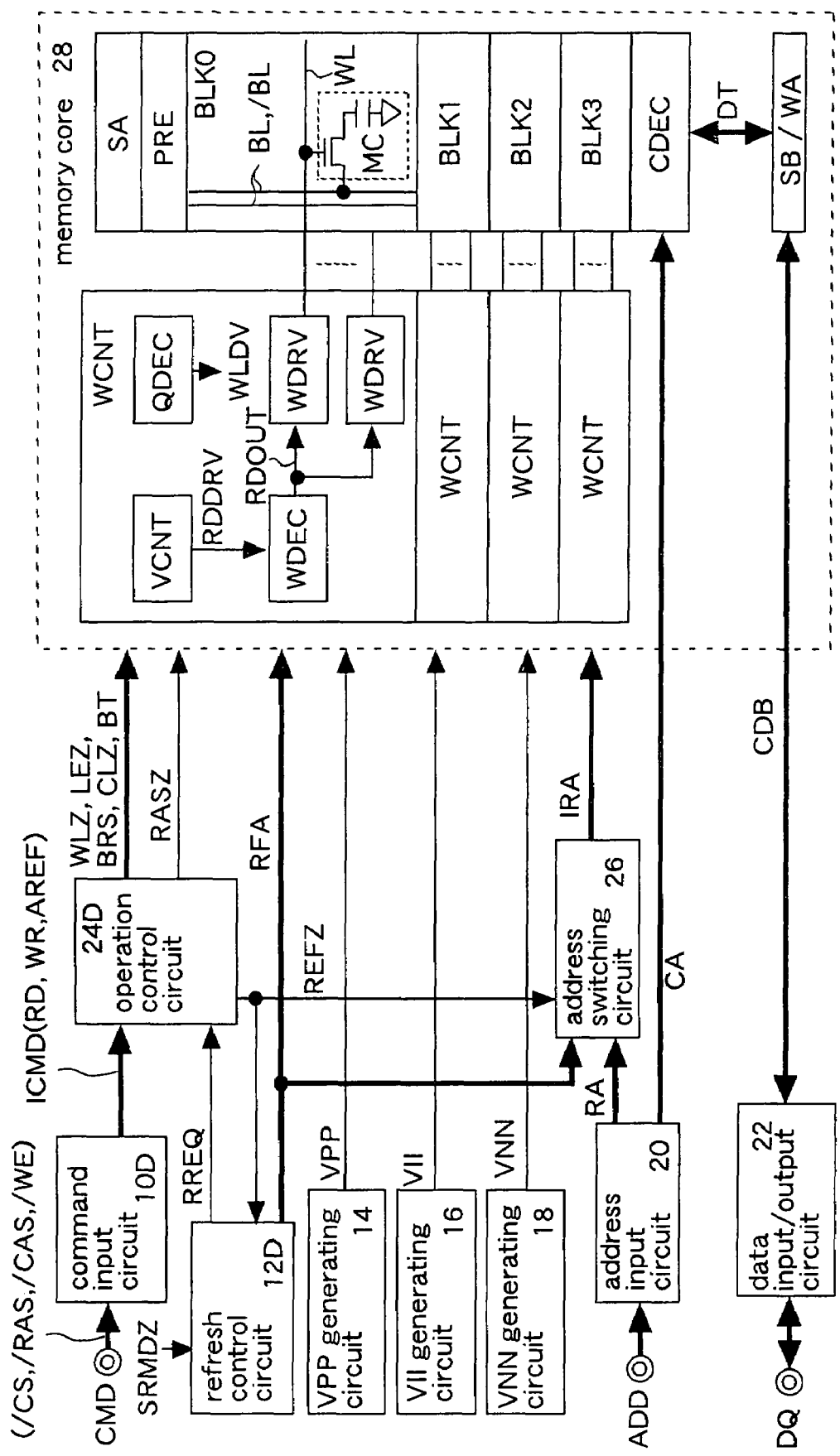
FIG. 28 is a block diagram showing an eighth embodiment of the present invention.

FIG. 28 shows an eighth embodiment of the semiconductor memory of the present invention. The same components as those described in the first embodiment will be assigned the same symbols and their detailed description will be omitted. The semiconductor memory in the present embodiment is formed as a DRAM having a self-refresh function using the CMOS process on a silicon substrate. The DRAM performs the read operation, the write operation, or the refresh operation (auto refresh operation) in response to the external command CMD during the normal operation mode. The DRAM performs the refresh operation in response to the refresh request signal RREQ output periodically by a refresh control circuit 12D during the self-refresh period SREF. The system SYS in the eighth embodiment is formed by replacing the pseudo SRAM in FIG. 6 with the DRAM.

In the present embodiment, instead of the command input circuit 10, the refresh control circuit 12, and the operation control circuit 24 in the first embodiment, a command input circuit 10D, the refresh control circuit 12D, and an operation control circuit 24D are formed. Other configurations are the same as those in the first embodiment. The operation of the DRAM is the same as that in the first embodiment (FIG. 7 to FIG. 12, FIG. 16) except in that the refresh operation REF during the activation period ACTV is performed in response to an auto refresh command AREF. In other words, the DRAM performs the first operation for setting the high level voltage line RDDRV to the boost voltage VPP during the access period of the corresponding memory block BLK and setting it to the internal power supply voltage VII during the access period of other memory blocks BLK.

In addition, during the activation period ACTV, the refresh blocks REFBLK are switched in response to the auto refresh command AREF, not to the refresh request signal RREQ. Because of this, the refresh request signal RREQ in FIG. 14 and FIG. 15 described above will be that shown in the diagram showing the operation of the present embodiment by being replaced with the auto refresh command AREF.

The command input circuit 10D (command decoder) receives the command signal CMD (for example, the chip select signal /CS, the row address strobe signal /RAS, the column address strobe signal /CAS, the write enable signal /WE, etc.) supplied via the command terminal. The command input circuit 10D decodes the received command signal CMD and outputs the internal command signal ICMD (the read command RD, the write command WR, the auto refresh command AREF) for operating the memory core 28.

The refresh control circuit 12D has the same refresh timer and refresh address counter as those in the refresh control circuit 12 in FIG. 1. However, the refresh control circuit 12D causes the refresh timer, not shown, to operate and generate the refresh request signal RREQ and the refresh address RFA only during the activation of a self-refresh mode signal SRMDZ. In addition, the refresh address counter of the refresh control circuit 12D operates in synchronization with the refresh request signal RREQ and the refresh signal REFZ from the operation control circuit 24D.

The self-refresh mode signal SRMDZ is activated only during the self-refresh period SREF of the DRAM. The self-refresh period SREF is a period from when receiving a self-refresh command at the command terminal CMD until receiving a self-refresh release command.

In addition to the function of the operation control circuit 24 in FIG. 1, the operation control circuit 24D has a function of performing the refresh operation REF in response to the auto refresh command AREF. The refresh request signal RREQ is generated only during the self-refresh period SREF. During the self-refresh period SREF, the external command CMD (RD, WR, AREF) is not supplied. Because of this, the operation control circuit 24D does not have the arbiter 25 in FIG. 1.

As described above, it is possible to obtain the same effect as that in the above-described first embodiment also in the eighth embodiment. Further, in the present embodiment, also in the DRAM having the self refresh mode, the GIDL current is reduced and the charge/discharge current of the high level voltage line RDDRV is reduced, and therefore, the current consumption can be reduced. In particular, the current consumption (standby current) during the self-refresh period SREF can be reduced.

By the way, in the above-described embodiments, examples in which the present invention is applied to the pseudo SRAM or the DRAM are described. The present invention is not limited to the embodiments. For example, it may also be possible to apply the present invention to a system LSI on which a pseudo SRAM core or a DRAM core is mounted. In addition, a pseudo SRAM or a DRAM to which the present invention is applied may be of clock asynchronous type or of clock synchronous type. Further, the present invention can be applied to another semiconductor memory (for example, an SRAM or a ferroelectric memory) in which a high voltage higher than the internal power supply voltage is applied to the gate of a transistor constituting a word driver.

In the above-described eighth embodiment, an example in which the present invention in the first embodiment is applied to the DRAM is described. The present invention is not limited to the embodiment. For example, the present invention in the second, third, fourth, and fifth embodiments may be applied to the DRAM. In this case, the operation of the DRAM is the same as that of each of the embodiments except in that the refresh operation REF during the activation period ACTV is performed in response to the auto refresh command AREF. In addition, the system SYS is formed by replacing the pseudo SRAM in FIG. 6 with the DRAM.

In the above-described sixth and seventh embodiments, an example is described, in which a setting unit (the mode register 40 or the program circuit 42) for switching the operating specification to the first or second specification is formed in the pseudo SRAM in the first embodiment. The present invention is not limited to the embodiments. For example, it may also be possible to form the setting unit (the mode register 40 or the program circuit 42) for switching the operating specification to the first or second specification in the pseudo SRAM in the second, third, fourth, and fifth embodiments or in the DRAM in the eighth embodiment.

In the second embodiment, when the operating specification is set to the first specification, the first operation is performed. When the operating specification is set to the second specification, the first operation is prohibited and the row driving signal lines RDDRV of all of the memory blocks BLK0-3 are connected to the boost voltage line VPP. In the third embodiment, when the operating specification is set to the first specification, the first or third operation is performed. When the operating specification is set to the second specification, the first and third operations are prohibited and the row driving signal lines RDDRV of all of the memory blocks BLK0-3 are connected to the boost voltage line VPP.

In the fourth embodiment, when the operating specification is set to the first specification, the first or fourth operation is performed. When the operating specification is set to the second specification, the first and fourth operations are prohibited and the row driving signal lines RDDRV of all of the memory blocks BLK0-3 are connected to the boost voltage line VPP. In the fifth embodiment, when the operating specification is set to the first specification, the first or fifth operation is performed. When the operating specification is set to the second specification, the first and fifth operations are prohibited and the row driving signal lines RDDRV of all of the memory blocks BLK0-3 are connected to the boost voltage line VPP.

In the eighth embodiment, when the operating specification is set to the first specification, the first or second operation is performed. When the operating specification is set to the second specification, the first and second operations are prohibited and the row driving signal lines RDDRV of all of the memory blocks BLK0-3 are connected to the boost voltage line VPP.

Further, it may also be possible to form a pseudo SRAM or a DRAM having the setting unit (the mode register 40 or the program circuit 42) and capable of performing at least two operations in FIG. 10, FIG. 18, FIG. 20, FIG. 22, and FIG. 25. In this case, the operations in FIG. 10, FIG. 18, FIG. 20, FIG. 22, and FIG. 25 are switched in accordance with the setting state of the setting unit, or these operations are prohibited and the row driving signal lines RDDRV of all of the memory blocks BLK0-3 are connected to the boost voltage line VPP.

In the above-described eighth embodiment, an example is described, in which the present invention is applied to the DRAM having a function of receiving the auto refresh command AREF. The present invention is not limited to the embodiment. For example, it may also be possible to apply the present invention to the DRAM that receives the refresh command together with the refresh address.

In the above-described embodiments, examples are described, in which the VPP generating circuit 14, the VII generating circuit 16, and the VNN generating circuit 18 are formed in the chip. The present invention is not limited to the embodiments. For example, at least any one of these circuits 14, 16, and 18 may not be formed. In this case, at least any one of the voltages VPP, VII, and VNN is supplied from the outside of the chip.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A semiconductor memory comprising:
   a plurality of memory blocks each having memory cells and a word line connected to the memory cells; and
   word control circuits formed corresponding to the memory blocks, respectively, and which each activates/inactivates level of the word line, wherein
   each of the word control circuits includes:
   a word decoder activating a word control signal to a low level voltage during an access period of the corresponding memory block and inactivating the word control signal to a high level voltage during a non-access period of the corresponding memory block;
   a word driver having a transistor that receives the word control signal at a gate and has its output connected to the word line, and which activates the word line selected by an address during the access period and inactivates the word line during the non-access period by using the transistor; and
   a voltage control circuit that performs a first operation connecting a high level voltage line to supply the high level voltage for the word control signal to the word decoder to a first high voltage line to which a first high voltage is supplied during the access period of the corresponding memory block and connecting the high level voltage line to a second high voltage line to which a second high voltage lower than the first high voltage is supplied during the non-access period of the corresponding memory block.

2. The semiconductor memory according to claim 1, further comprising a setting unit setting an operating specification of the semiconductor memory to a first specification or a second specification by an external control, wherein
the voltage control circuit performs the first operation when a set value of the setting unit indicates the first specification, and prohibits the first operation and continues the connection of the high level voltage lines of all of the memory blocks with the high level voltage line when the set value of the setting unit indicates the second specification.

3. The semiconductor memory according to claim 1, further comprising a refresh address counter sequentially generating a refresh address indicative of the memory cell that refreshes and a refresh block being a memory block to which the memory cell that refreshes belongs, in response to an internal refresh request, wherein:
the access period has an activation period during which the memory cell is accessed in response to an access request and a self-refresh period during which reception of access request from an outside of the memory is prohibited and the memory cell is refreshed in response to the refresh request that is generated internally;
the voltage control circuit corresponding to the memory block other than the refresh block performs the first operation; and
the voltage control circuit corresponding to the refresh block performs a second operation continuing the connection of the high level voltage line with the first high voltage line.

4. The semiconductor memory according to claim 3, further comprising a setting unit setting an operating specification of the semiconductor memory to a first specification or a second specification by an external control, wherein
the voltage control circuit performs the first operation or the second operation in accordance with the refresh address when a set value of the setting unit indicates the first specification, and prohibits the first operation and the second operation and continues the connection of the high level voltage lines of all of the memory blocks with the high level voltage line when the set value of the setting unit indicates the second specification.

5. The semiconductor memory according to claim 1, wherein:
the access period has an activation period during which the memory cell is accessed in response to an access request and a self-refresh period during which reception of access request from an outside of the memory is prohibited and the memory cell is refreshed in response to a refresh request that is generated internally; and
the voltage control circuit performs the first operation during the self-refresh period and performs a third operation connecting the high level voltage line to the first high voltage line during the activation period.

6. The semiconductor memory according to claim 5, further comprising a setting unit setting an operating specification of the semiconductor memory to a first specification or a second specification by an external control, wherein
the voltage control circuit performs the first operation or the third operation corresponding to the access period when a set value of the setting unit indicates the first specification, and prohibits the first operation and the third operation and continues the connection of the high level voltage lines of all of the memory blocks with the high level voltage line when the set value of the setting unit indicates the second specification.

7. The semiconductor memory according to claim 1, wherein:
the access period has an activation period during which the memory cell is accessed in response to an access request and a self-refresh period during which reception of access request from an outside of the memory is prohibited and the memory cell is refreshed in response to a refresh request that is generated internally; and
the voltage control circuit performs the first operation during the self-refresh period and performs a fourth operation, during the activation period, connecting the high level voltage line to the first high voltage line when any one of the memory blocks is accessed and connecting the high level voltage line to the second high voltage line when none of the memory blocks is accessed.

8. The semiconductor memory according to claim 7, further comprising a setting unit for setting an operating specification of the semiconductor memory to a first specification or a second specification by an external control, wherein
the voltage control circuit performs the first operation or the fourth operation corresponding to the access period when a set value of the setting unit indicates the first specification, and prohibits the first operation and the fourth operation and continues the connection of the high level voltage lines of all of the memory blocks with the high level voltage line when the set value of the setting unit indicates the second specification.

9. The semiconductor memory according to claim 1, wherein:
the access period has an activation period during which the memory cell is accessed in response to an access request and a self-refresh period during which reception of access request from an outside of the memory is prohibited and the memory cell is refreshed in response to a refresh request that is generated internally; and
the voltage control circuit performs a fifth operation connecting the high level voltage line to the first high voltage line in response to the access request during the activation period and connecting the high level voltage line to the second high voltage line in response to the completion of a refresh operation corresponding to the refresh request during the self-refresh period, and performs the first operation during the self-refresh period during which the fifth operation is not performed.

10. The semiconductor memory according to claim 9, further comprising a setting unit for setting an operating specification of the semiconductor memory to a first specification or a second specification by an external control, wherein
the voltage control circuit performs the first operation or the fifth operation corresponding to the access period when a set value of the setting unit indicates the first specification and prohibits the first operation and the fifth operation and continues the connection of the high level voltage lines of all of the memory blocks with the high level voltage line when the set value of the setting unit indicates the second specification.

11. The semiconductor memory according to claim 1, further comprising:
a command decoder that decodes a read command and a write command, which are an access request supplied via an external terminal;
a refresh control circuit that generates a refresh command, which is the refresh request, at a predetermined period; and
an operation control circuit that outputs a timing signal that operates the memory block in order to perform a read operation and a write operation in response to the read command and the write command and a refresh operation in response to the refresh command, wherein the operation control circuit includes an arbiter that determines which one of the read operation or the write operation and the refresh operation is given priority when the read command and the write command, and the refresh command conflict with each other.

12. The semiconductor memory according to claim 1, further comprising:

a command decoder that decodes a read command and a write command, which are an access request supplied via an external terminal, during a normal operation mode;

a refresh control circuit that generates a refresh command, which is a refresh request, at a predetermined period during a self-refresh mode during which the access request is not accepted; and an operation control circuit that outputs a timing signal that operates the memory block in order to perform an access operation in response to the read command and the write command and a refresh operation in response to the refresh command.

13. The semiconductor memory according to claim 2, wherein the setting unit includes a mode register set in accordance with an external command.

14. The semiconductor memory according to claim 2, wherein the setting unit includes a program circuit having a programmable nonvolatile memory unit.

15. A system including a semiconductor memory and a controller which controls access to the semiconductor memory, wherein the semiconductor memory comprises:

a plurality of memory blocks each having memory cells and a word line connected to the memory cells; and word control circuits formed corresponding to the memory blocks, respectively, and which each activates/inactivates level of the word line, wherein each of the word control circuits includes:

a word decoder activating a word control signal to a low level voltage during an access period of the corresponding memory block and inactivating the word control signal to a high level voltage during a non-access period of the corresponding memory block;

a word driver having a transistor that receives the word control signal at a gate and has its output connected to the word line, and which activates the word line selected by an address during the access period and inactivates the word line during the non-access period by using the transistor; and a voltage control circuit that performs a first operation connecting a high level voltage line to supply the high level voltage for the word control signal to the word decoder to a first high voltage line to which a first high voltage is supplied during the access period of the corresponding memory block and connecting the high level voltage line to a second high voltage line to which a second high voltage lower than the first high voltage is supplied during the non-access period of the corresponding memory block.

* * * * *